(12) United States Patent
Venkatachari

(10) Patent No.: US 12,625,216 B2
(45) Date of Patent: May 12, 2026

(54) MAGNETIC RESONANCE IMAGING TECHNIQUES INTEGRATING VARIABLE RATE SELECTIVE EXCITATION (VERSE) AND FLOW COMPENSATION ALONG SLICE

(71) Applicant: GE Precision Healthcare LLC, Waukesha, WI (US)

(72) Inventor: Anand Venkatachari, Brookfield, WI (US)

(73) Assignee: GE Precision Healthcare LLC, Waukesha, WI (US)

( * ) Notice: Subject to any disclaimer, the term of this patent is extended or adjusted under 35 U.S.C. 154(b) by 133 days.

(21) Appl. No.: 18/610,642

(22) Filed: Mar. 20, 2024

(65) Prior Publication Data

US 2025/0298109 A1     Sep. 25, 2025

(51) Int. Cl.
*G01R 33/561*        (2006.01)
*G01R 33/56*         (2006.01)

(52) U.S. Cl.
CPC ....... *G01R 33/561* (2013.01); *G01R 33/5608* (2013.01)

(58) Field of Classification Search
CPC .......................... G01R 33/5608; G01R 33/561
See application file for complete search history.

(56) References Cited

U.S. PATENT DOCUMENTS

| | | | |
|---|---|---|---|
| 5,572,126 A | 11/1996 | Shinnar | |
| 6,275,040 B1 * | 8/2001 | Zur ...................... | G01R 33/446 |
| | | | 324/320 |
| 7,440,791 B2 * | 10/2008 | Deimling ............. | G01R 33/563 |
| | | | 600/407 |
| 10,641,855 B2 | 5/2020 | Pendse et al. | |
| 2006/0061358 A1 | 3/2006 | Hargreaves et al. | |
| 2015/0301131 A1 | 10/2015 | Hardy | |
| 2016/0131731 A1 | 5/2016 | Oka | |
| 2018/0292487 A1 | 10/2018 | Weingartner et al. | |
| 2019/0064293 A1 | 2/2019 | Zhang et al. | |

* cited by examiner

*Primary Examiner* — Gregory H Curran
(74) *Attorney, Agent, or Firm* — Amin, Turocy & Watson, LLP

(57)        ABSTRACT

Magnetic resonance imaging techniques integrating variable rate selective excitation (VERSE) and flow compensation along slice are described. According to an example, a method comprises determining, by a device comprising a processer, a two-dimensional (2D) spin echo sequence applicable for acquiring, via a MRI system, signal data associated with a slice of an anatomical region of a subject, wherein determining the 2D spin echo sequence comprises determining the 2D spin echo sequence in accordance with a combination of a VERSE protocol and a flow compensation along slice protocol. The method further comprises controlling, by the device, acquisition of the signal data by the MRI system using the 2D spin echo sequence, and reconstructing, by the device, an image of the slice from the signal data.

20 Claims, 11 Drawing Sheets

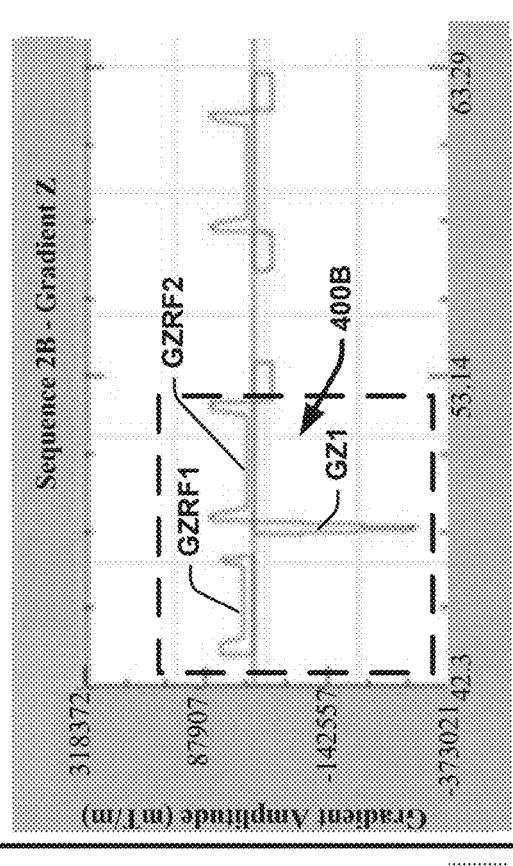
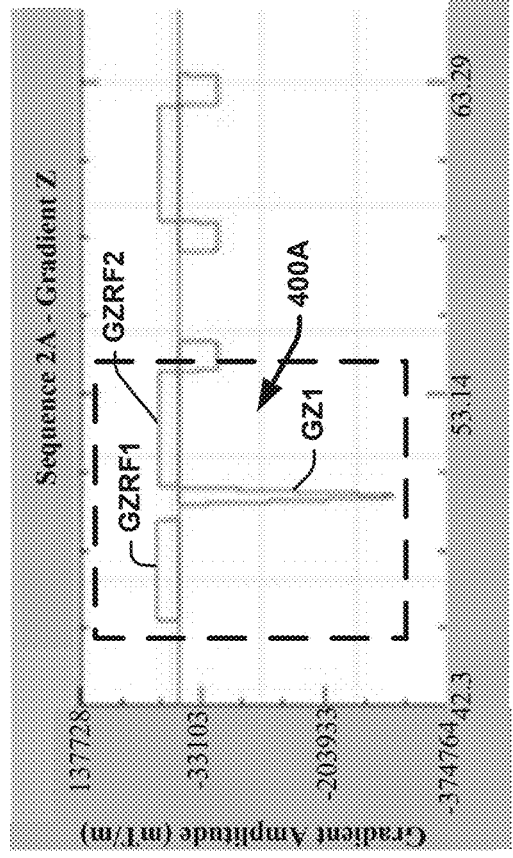
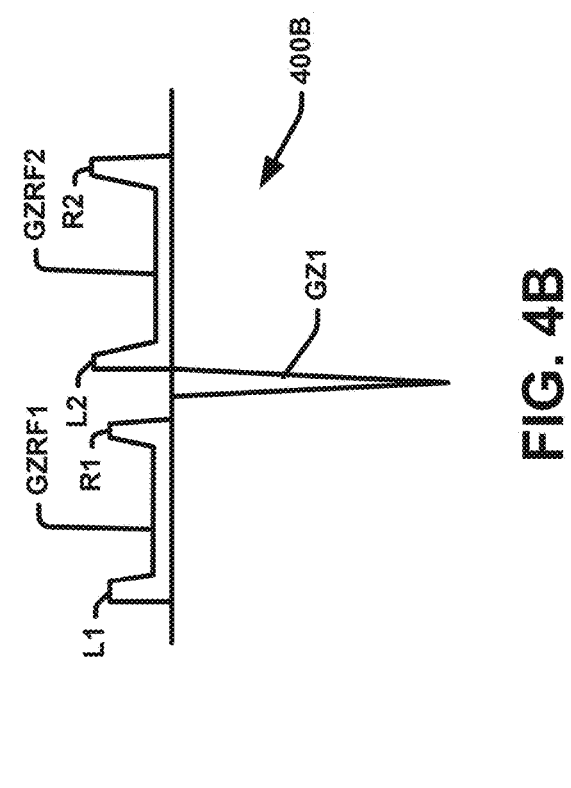
FIG. 4B
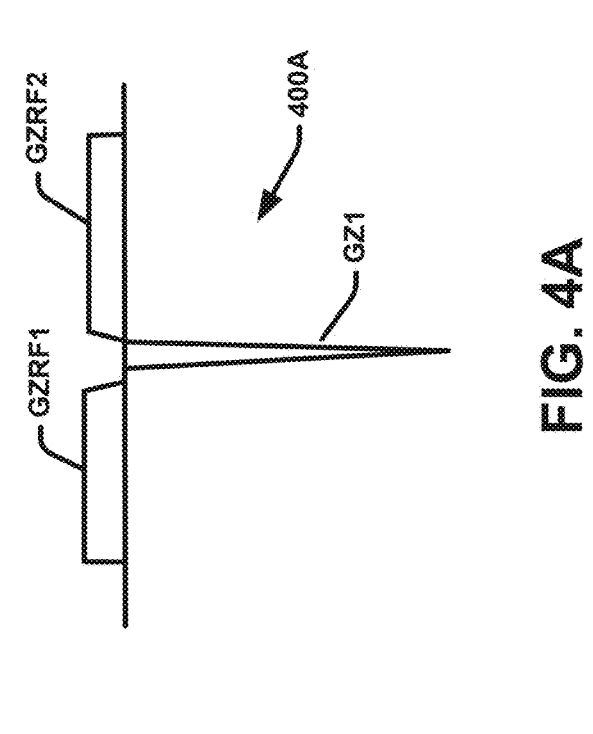
FIG. 4A

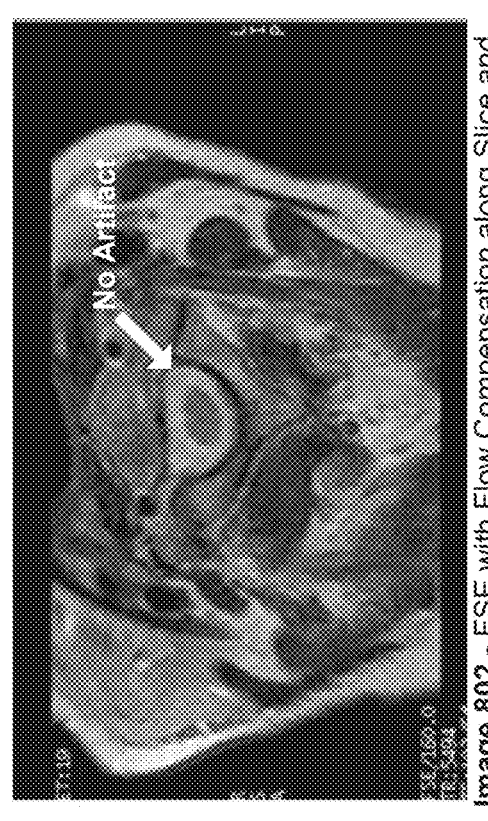
Image 802 - FSE with Flow Compensation along Slice and VERSE
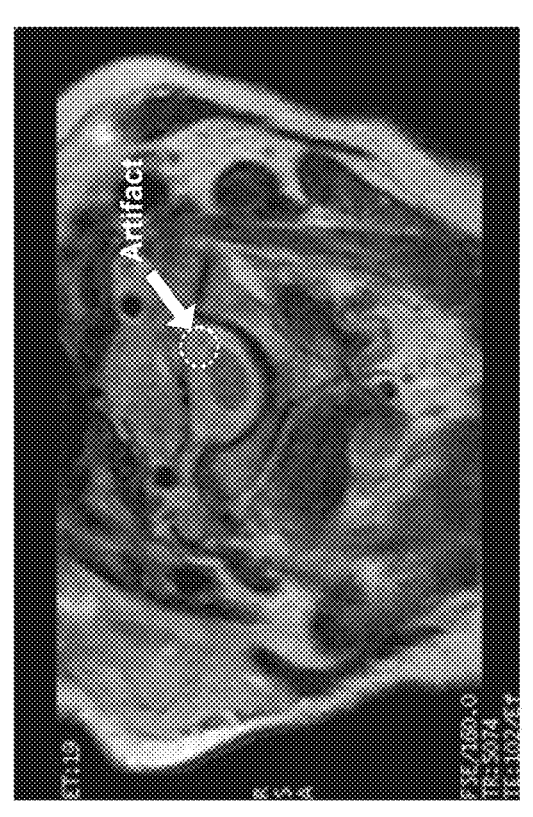
Image 803 - FSE with NO Flow Compensation along Slice or VERSE
Image 801 - FSE with Flow Compensation along Slice
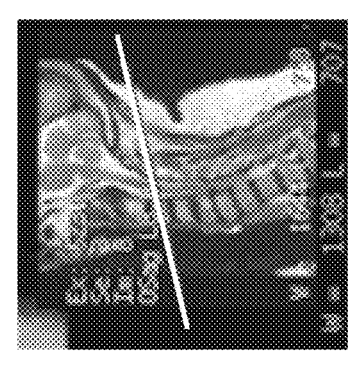
Image 800
FIG. 8

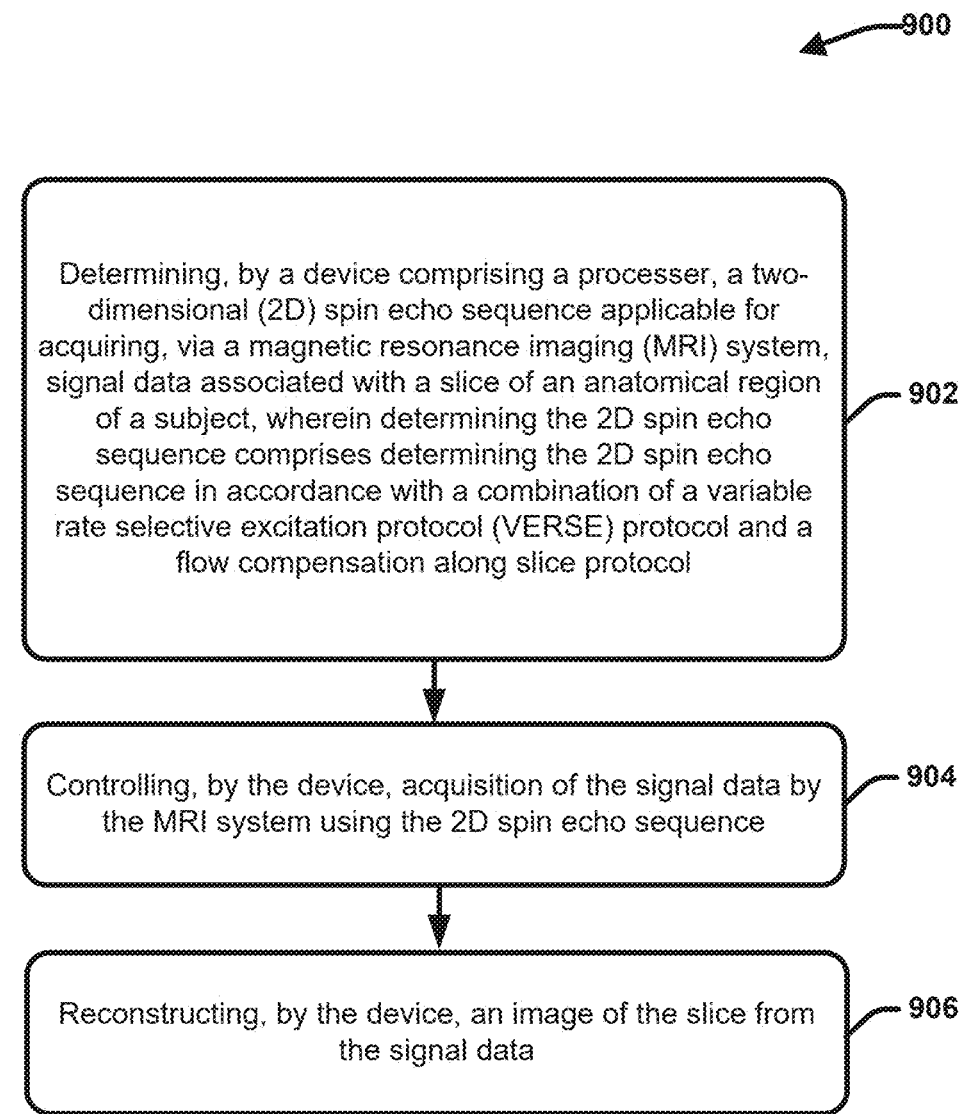

Determining, by a device comprising a processer, a two-dimensional (2D) spin echo sequence applicable for acquiring, via a magnetic resonance imaging (MRI) system, signal data associated with a slice of an anatomical region of a subject, wherein determining the 2D spin echo sequence comprises determining the 2D spin echo sequence in accordance with a combination of a variable rate selective excitation protocol (VERSE) protocol and a flow compensation along slice protocol

902

Controlling, by the device, acquisition of the signal data by the MRI system using the 2D spin echo sequence

904

Reconstructing, by the device, an image of the slice from the signal data

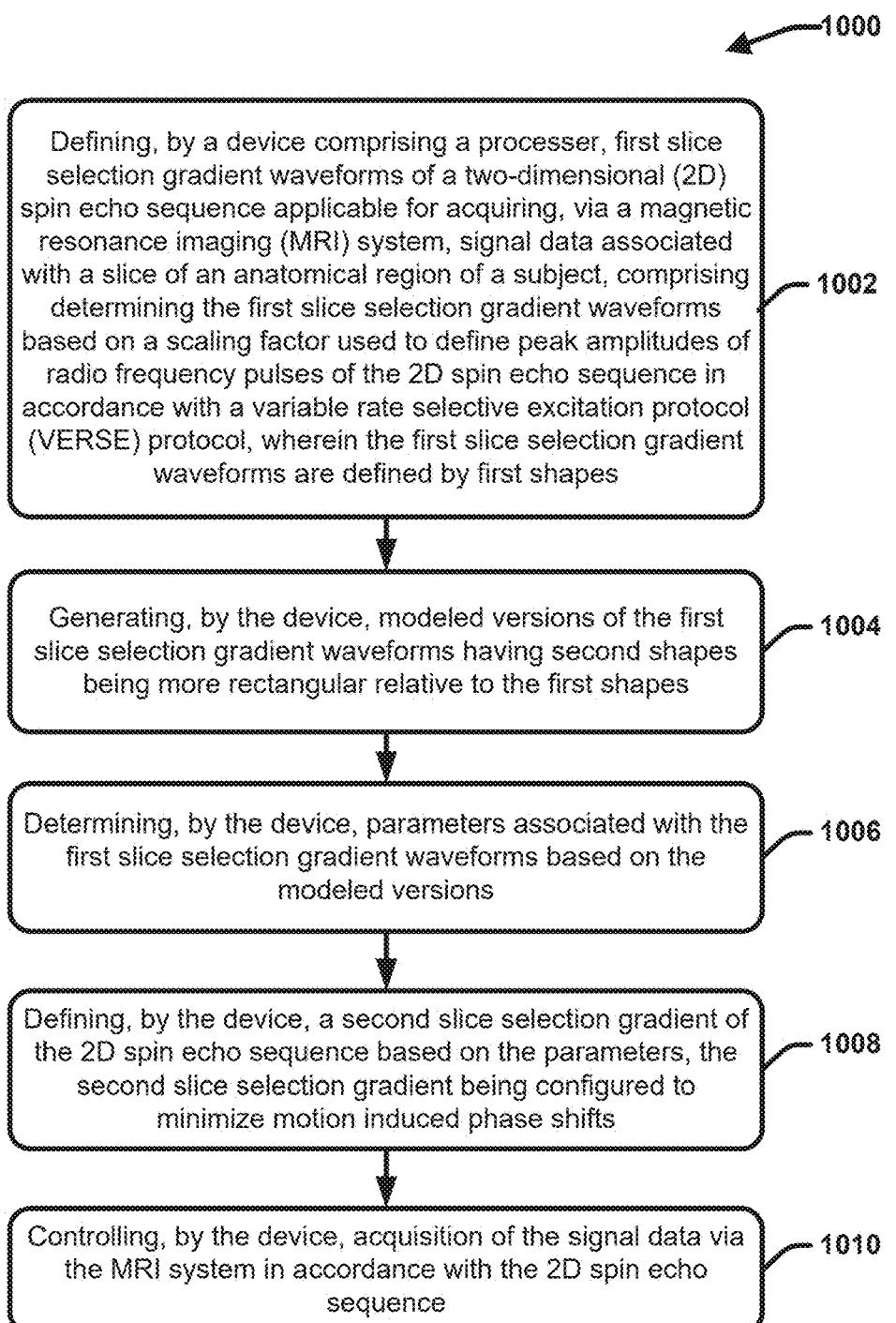

1000

Defining, by a device comprising a processer, first slice selection gradient waveforms of a two-dimensional (2D) spin echo sequence applicable for acquiring, via a magnetic resonance imaging (MRI) system, signal data associated with a slice of an anatomical region of a subject, comprising determining the first slice selection gradient waveforms based on a scaling factor used to define peak amplitudes of radio frequency pulses of the 2D spin echo sequence in accordance with a variable rate selective excitation protocol (VERSE) protocol, wherein the first slice selection gradient waveforms are defined by first shapes — 1002

Generating, by the device, modeled versions of the first slice selection gradient waveforms having second shapes being more rectangular relative to the first shapes — 1004

Determining, by the device, parameters associated with the first slice selection gradient waveforms based on the modeled versions — 1006

Defining, by the device, a second slice selection gradient of the 2D spin echo sequence based on the parameters, the second slice selection gradient being configured to minimize motion induced phase shifts — 1008

Controlling, by the device, acquisition of the signal data via the MRI system in accordance with the 2D spin echo sequence — 1010

FIG. 10

MAGNETIC RESONANCE IMAGING TECHNIQUES INTEGRATING VARIABLE RATE SELECTIVE EXCITATION (VERSE) AND FLOW COMPENSATION ALONG SLICE

TECHNICAL FIELD

This application relates to magnetic resonance imaging (MRI) and more particularly to MRI techniques integrating variable rate selective excitation (VERSE) and flow compensation along slice.

BACKGROUND

The specific absorption rate (SAR) is a measure of the rate at which energy is absorbed by the body when exposed to radiofrequency (RF) electromagnetic fields during a magnetic resonance imaging (MRI) scan. SAR is typically measured in units of watts per kilogram (W/kg). During an MRI scan, the RF pulses used to excite the protons in the body can cause heating of the tissues. SAR quantifies the amount of energy absorbed by the body per unit mass over time. It is an important safety consideration in MRI to ensure that the amount of energy absorbed does not exceed safe limits to prevent tissue heating and potential adverse effects. While MRI is generally considered a safe imaging modality, excessive tissue heating can cause burns, nerve stimulation, and other adverse effects.

Flow compensation is a technique used in magnetic resonance imaging (MRI) to minimize or eliminate the effects of motion-related artifacts (referred to herein as flow artifacts) in the acquired images caused by flowing substances within the body, such as blood or cerebrospinal fluid. When imaging moving tissues or fluids, such as blood vessels or the cerebrospinal fluid, the motion can lead to undesirable artifacts in the MRI images. These flow artifacts can distort the anatomy being imaged and potentially lead to misinterpretation of the results.

Flow compensation along slice in MRI refers to the application of flow compensation techniques to minimize or eliminate flow artifacts caused by motion perpendicular to the imaging plane, typically encountered in multi-slice imaging sequences in two-dimensional (2D) MRI. In 2D MRI, slice selection is achieved by applying a gradient magnetic field along the direction of the slice (typically the z-direction in a conventional MRI scanner). During the acquisition of multiple slices, there can be motion or flow of substances perpendicular to the slice direction, which can lead to phase errors and flow artifacts in the acquired images. To compensate for this motion and minimize its effects, flow compensation techniques along the slice direction can be employed. These techniques typically involve modifying the slice selection gradient waveform to account for motion in the slice direction. By carefully timing the application of gradient pulses in the slice selection direction, it is possible to null or minimize the effects of motion-induced phase shifts along the slice direction.

Using flow compensation along slice direction is of critical importance to reduce flow artifacts in 2D MRI scans involving multiple slices to cover the anatomical region of interest. Unfortunately, existing spin echo sequences used for multi-slice imaging can be very SAR intensive. Thus, techniques for reducing the SAR of multi-slice 2D MRI scans integrating flow compensation along slice are desired.

SUMMARY

The following presents a summary to provide a basic understanding of one or more embodiments of the invention.

This summary is not intended to identify key or critical elements or delineate any scope of the different embodiments or any scope of the claims. Its sole purpose is to present concepts in a simplified form as a prelude to the more detailed description that is presented later. In one or more embodiments, systems, computer-implemented methods, apparatus and/or computer program products are described that provide MRI techniques integrating variable rate selective excitation (VERSE) and flow compensation along slice.

According to an embodiment, an MRI system is provided that comprises at least one memory that stores computer-executable components, and at least one processor that executes the computer-executable components stored in the at least one memory. The computer-executable components comprise a configuration component that determines a 2D spin echo sequence applicable for acquiring, via the MRI system, signal data associated with a slice of an anatomical region of a subject, wherein the configuration component determines the 2D spin echo in accordance with a combination of a VERSE protocol and a flow compensation along slice protocol. The computer-executable components further comprise a control component that controls acquisition of the signal data by the MRI system using the 2D spin echo sequence, and a reconstruction component that generates an image of the slice from the signal data.

To this end, based determining the 2D spin echo sequence in accordance with the combination, the image comprises a defined image quality and a SAR of the acquisition is reduced relative to another SAR of a similar acquisition using a similar 2D spin echo sequence defined in accordance with the flow compensation along slice protocol and without the VERSE protocol. In this regard, the defined image quality comprises absence of flow artifacts or an amount of the flow artifacts being less than a defined amount.

In some embodiments, elements described in the disclosed systems can be embodied in different forms such as a computer-implemented method, a computer program product, or another form.

DESCRIPTION OF THE DRAWINGS

FIGS. 4A and 4B present close-up views of slice selection gradients of examples FSE sequence waveforms in accordance with flow compensation along slice with and without VERSE, in accordance with one or more embodiments of the disclosed subject matter.

FIG. 8 presents example MRI images acquired with different acquisition protocols in accordance with one or more embodiments of the disclosed subject matter.

FIG. 9 presents a high-level flow diagram of an example computer-implemented method for performing an MRI scan using a combination of a VERSE protocol and a flow compensation along slice protocol, in accordance with one or more embodiments of the disclosed subject matter.

FIG. 10 presents a high-level flow diagram of another example computer-implemented method for performing an MRI scan using a combination of a VERSE protocol and a flow compensation along slice protocol, in accordance with one or more embodiments of the disclosed subject matter.

DETAILED DESCRIPTION

Figure 1:
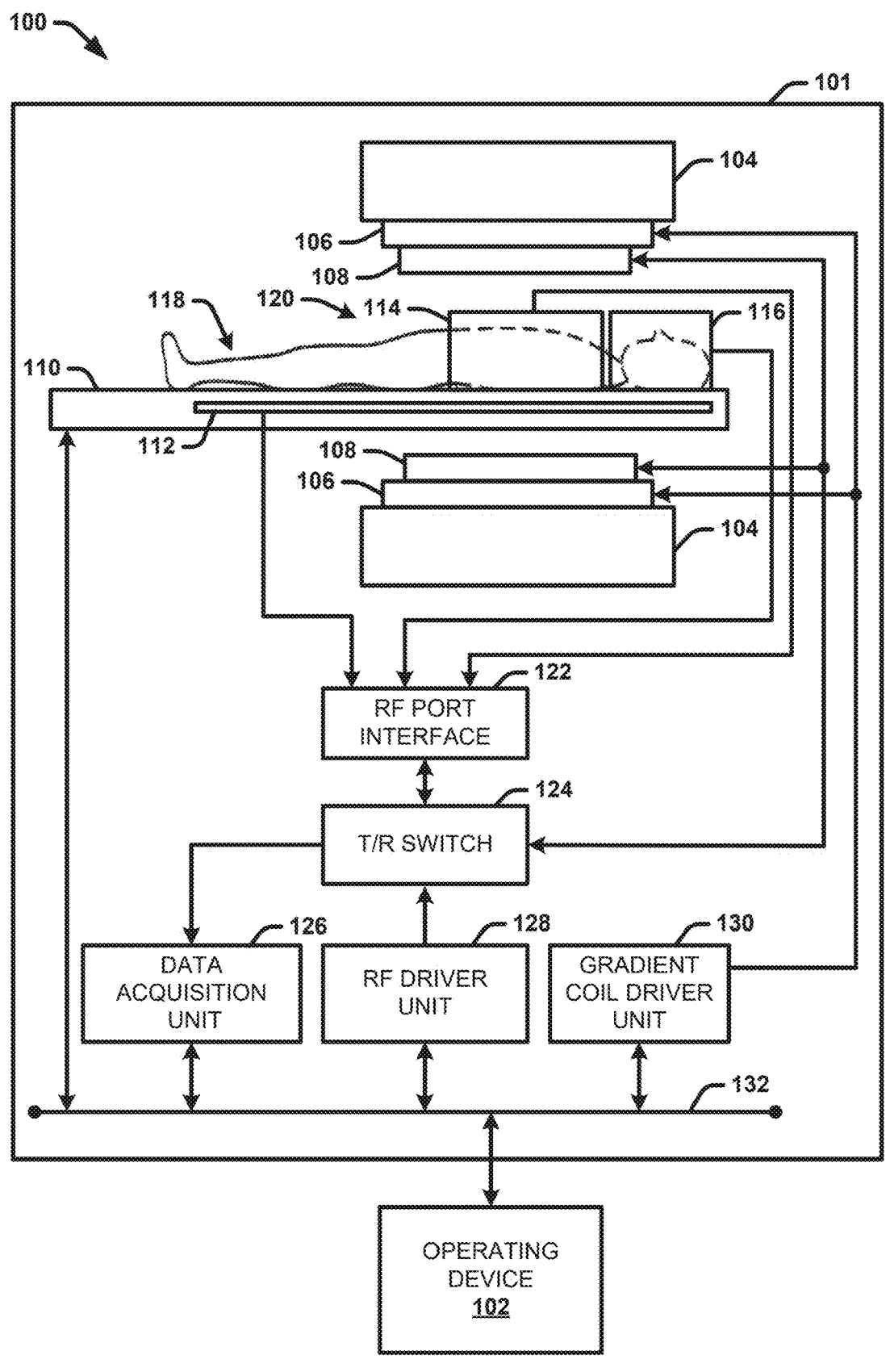
FIG. 1 presents an example MRI system in accordance with one or more embodiments of the disclosed subject matter.

The following detailed description is merely illustrative and is not intended to limit embodiments and/or application or uses of embodiments. Furthermore, there is no intention to be bound by any expressed or implied information presented in the preceding Background section, Summary section or in the Detailed Description section.

The disclosed subject matter is directed to systems, computer-implemented methods, apparatus and/or computer program products that provide MRI techniques integrating variable rate selective excitation (VERSE) and flow compensation along slice. As described in the Background section, using flow compensation along slice selection direction is of critical importance to reduce flow artifacts in 2D MRI scans involving multiple slices to cover the anatomical region of interest. Unfortunately, existing spin echo sequences used for multi-slice imaging, such as the original spin echo sequence, the fast spin echo sequence (FSE), and the turbo spin echo sequence, can be very SAR intensive. Thus, techniques for reducing the SAR of multi-slice 2D MRI scans integrating flow compensation along slice are desired.

Variable rate selective excitation (VERSE) is a technique used in MRI to selectively excite specific regions of interest with varying degrees of spatial resolution or signal intensity. In conventional MRI, excitation pulses are typically applied uniformly across the entire imaging volume, leading to uniform signal excitation and image contrast throughout the region of interest. However, in some cases, it may be desirable to selectively excite only certain regions within the imaging volume while suppressing signal from other areas. VERSE allows for the selective excitation of different regions within the imaging volume by adjusting the timing and characteristics of the excitation RF pulses. By modulating parameters such as the pulse amplitude, duration, frequency, or phase, it is possible to tailor the excitation profile to target specific regions while minimizing signal from surrounding tissues. VERSE sequences are often designed with careful consideration of pulse sequence parameters, such as flip angle, repetition time, and pulse amplitude, to achieve the desired imaging goals while minimizing RF power deposition. By optimizing these parameters, VERSE sequences can reduce the overall RF power required for imaging and in turn reduce the SAR of the scan.

With this context in mind, the inventor of the of the subject innovation has realized a mechanism to combine VERSE techniques with flow compensation along slice to reduce the SAR of a 2D MRI scan while improve image quality in flow sensitive areas. In various embodiments, VERSE is utilized to define a 2D spin echo sequence with reduced RF power by reducing the peak amplitude of the RF pulses by a certain scaling factor and reshaping the corresponding slice selection gradient waveforms based on the scaling factor to excite the same slice. More particularly, the VERSE technique applied scales the slice selection gradient waveforms based on the (reduced) amplitude or the RF pulses. These gradient waveforms are not constant, and the shapes of these gradient waveforms are irregular. In this regard, the VERSE tailored slice selection gradient waveforms are not rectangular as they are shaped in accordance with conventional flow compensation along slice.

To this end, as described in the Background section, flow compensation along slice also involves modifying the slice selection gradient waveforms to account for motion in the slice direction. By carefully defining the parameters which control the shape and timing of application of the slice selection gradients, it is possible to null or minimize the effects of motion-induced phase shifts along the slice direction. However, the irregularities in the shape of the VERSE slice selection gradients created as a result of applying the above noted VERSE technique serves as an obstacle for being able to further tailor the slice selection gradient waveform parameters in a manner that achieves the desired flow compensation effects.

In order to overcome this obstacle, the MRI sequence configuration software employed by the MRI system converts the irregular shaped VERSE slice selection gradient waveforms into modeled equivalent, rectangular shapes in association with calculating reference waveform parameters applicable for the slice selection gradients to achieve the desired flow compensation effects. In this regard, using rectangular shaped gradients, the configuration software computes the areas under the respective rectangular shaped gradients and uses these area metrics to calculate the reference waveform parameter values. The configuration software then uses these reference waveform parameter values to define an additional slice selection gradient waveform that facilitates flow compensation along slice. This additional slice selection gradient waveform corresponds to the slice rephaser gradient waveform. The configuration software of the MRI system then configures the MRI sequence using the irregular shaped slice selection gradients (providing the reduced SAR) and using the slice rephaser gradient waveform.

To this end, both VERSE and flow compensation along slice direction involve tailoring the slice selection gradient waveform in different ways to achieve different goals. Owing to the complexities of both techniques and the manner in which the slice selection gradient waveform is adapted with respect to both techniques, a mechanism for combining VERSE with flow compensation along slice has not been explored in the field until now. In accordance with flow compensation along slice, inaccuracies in gradient timing or calibration can result in incomplete flow compensation or unintended phase shifts, leading to artifacts in the acquired images. Accordingly, proper calibration and adjustment of gradient timings is essential to minimize these errors. The inventor of the subject innovation has applied the disclosed combined VERSE with flow compensation along slice mechanism with a 2D FSE sequence to successfully generate MRI images of the spine without flow artifacts and reduced RF power, thus demonstrating the how the disclosed techniques can be used to accurately calibrate and define the slice selection gradients for flow compensation in combination with VERSE.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Turning now to the drawings, FIG. 1 illustrates an example MRI system 100 in accordance with one or more embodiments of the disclosed subject matter. MRI system 100 includes an MRI machine 101 and an operating device 102 that controls operations of the MRI machine 101. The operating device 102 can be communicatively and operatively connected to the MRI machine 101 (and/or respective elements thereof) via a system bus 132 and/or via any suitable wired or wireless communication network. The operating device 102 can include or correspond to one or more computing devices that control operations of the MRI machine 101, including controlling acquisition of magnetic resonance (MR) signal data (e.g., via the data acquisition unit 126) associated with one or more slices of an anatomical region of a subject 118 used to reconstruct images of the slices. The operating device 102 also receives the acquired MR signal data and performs image reconstruction using the MR signal data to generate the images. The operating device 102 can further display (e.g., via a suitable electronic display associated with the operating device 102) the reconstructed images, store the images, and/or send the images to another system/device. Additional details regarding the features and functionalities of the operating device 102 are described below with reference to FIG. 2.

The MRI machine 101 can include or correspond to any existing or future MRI machine capable of performing any existing or future 2D MRI process (e.g., a spin echo process, a FSE process, a TSE process, or the like). As used herein, 2D MRI refers to an MRI process in which MR data is acquired in a series of 2D slices, each representing a cross-sectional view of the imaged anatomy. In accordance with 2D MRI, the MRI machine 101 acquires signal data one slice at a time, with each slice being acquired sequentially using pulse sequences tailored to the desired imaging plane (e.g., axial, sagittal, or coronal). Each 2D slice is reconstructed independently to generate a single 2D image. On the other hand, in 3D MRI, imaging data is acquired volumetrically, covering the entire imaging volume in three dimensions. The MRI scanner acquires data in a single continuous 3D volume, typically using a 3D imaging sequence such as 3D gradient echo or 3D TSE. The acquired 3D volume contains information about the entire imaged anatomy in three dimensions, without the need for sequential slice acquisitions. Reconstruction of 3D MRI data involves processing the entire volumetric dataset to generate a series of contiguous slices or multiplanar reformats (MPRs) in any desired orientation. To this end, MRI system 100 can correspond to an MRI system capable of performing both 2D and 3D MRI scans, the disclosed techniques are particularly directed to optimizing 2D MRI sequences in association with performing 2D MRI scans.

Generally, the MRI machine 101 works based on the principles of nuclear magnetic resonance (NMR) and utilizes a combination of strong magnetic fields, radiofrequency (RF) pulses, and computer processing (performed via data acquisition unit 126 and operating device 102) to produce detailed images inside the body. In this regard, the human body is composed largely of water molecules, which contain hydrogen atoms. When a subject 118 enters MRI machine 101, the hydrogen nuclei (protons) within their body align with a strong, constant and uniform magnetic field generated by the MRI machine 101. This main magnetic field is generally referred to B0. The MRI machine 101 generates brief RF pulses directed to the area of the body of the subject 118 being imaged. The RF pulses are tuned to the resonant frequency of the protons in the body, which is determined by the strength of the main magnetic field B0. When each RF pulse is applied, it perturbs the alignment of the protons, causing them to absorb energy and move out of alignment with the main magnetic field B0. This process is known as excitation. After the RF pulse is turned off, the hydrogen nuclei gradually return to their original alignment with the main magnetic field B0. As they do so, they emit RF signals, a process known as relaxation.

RF coils within the MRI machine 101 detect the RF signals emitted by the relaxing protons. These RF signals contain information about the spatial distribution of protons within the body. The detected RF signals are converted into electrical signals (e.g., via data acquisition unit 126) and sent to a computer (e.g., operating device 102) for processing. The computer collects and organizes the signals based on their spatial information and signal strength, storing them as raw data. Using sophisticated algorithms, the computer processes the raw data to reconstruct a detailed image of the inside of the body. Different tissues within the body produce varying signals based on their composition and structure, resulting in contrast in the final image.

To create an image, the MRI machine 101 employs gradient magnetic fields (generally referred to herein as gradients), which vary in strength across the imaging volume. These gradients encode spatial information into the emitted RF signals, allowing the MRI system 100 to determine the location of each received RF signal within the body. These gradient magnetic fields are additional magnetic fields superimposed onto the main magnetic field B0. These gradients vary in strength along the x, y, and z axes of the MRI scanner. Gradient coils within the MRI machine 101 produce these gradient magnetic fields. By controlling the strength and timing of these gradients in combination with controlling the timing, strength and frequency of the RF pulses, spatial encoding is achieved, allowing for the localization of the emitted RF signals from different regions of the body. The information defining the specific strength and timing of the RF pulses and the gradients for a particular imaged slice is referred to as the MRI sequence and is typically graphically represented as a waveform (e.g., such as waveforms 300A and 300B, described infra with reference to FIGS. 3A and 3B). In this regard, in accordance with 2D MRI, the MRI sequence waveform defines the timing, shape, and characteristics of the RF pulses, the gradient magnetic fields, and the signal acquisition schemes applied to acquire MR signal data used to reconstruct an image of a slice of an anatomical region of the subject.

In this regard, MRI machine 101 includes a magnetostatic field magnet unit 104, a gradient coil unit 106, an RF body coil unit 108, one or more local RF coil arrays (112, 114, and 116), an RF port interface 122, a transmit/receive (T/R) switch 124, a data acquisition unit 126, an RF driver unit 128, and a gradient coil driver unit 130. MRI machine 101 also includes a table upon which the subject 118 being imaged is positioned. The subject 118 may be moved inside and outside the imaging space 120 by moving the table 110 based on control signals provided by the operating device 102.

The magnetostatic field magnet unit 104 includes, for example, typically an annular superconducting magnet, which is mounted within a toroidal vacuum vessel. The magnet defines a cylindrical space surrounding the subject 118 and generates the constant, primary magnetostatic field $B_0$. The MRI machine 101 further includes a gradient coil unit 106 that generates the magnetic field gradients, and a radio frequency (RF) system including an RF body coil unit 108 and/or one or more local RF coil arrays 112, 114 and 116, that transmit the RF pulses directed to the tissues within the particular slice of the subject being imaged, and receive the RF signals emitted by the protons during relaxation.

Based on control signals from the operating device 102, gradient waveforms for performing a prescribed 2D scan are applied to the gradient coil unit 106 by the gradient coil driver unit 130 to produce the magnetic field gradients $G_x$, $G_y$ and $G_z$ that are used for spatially encoding the RF signals. In particular, the gradient coil unit 106 includes three gradient coil systems, each of which generates a gradient magnetic field which inclines into one of the three spatial axes (e.g., axes x, y and z, perpendicular to each other) of the MRI machine 101, and generates a gradient field in the direction of each axis. The gradient coil driver unit 130 includes three systems of driver circuits (not shown) corresponding to the three gradient coil systems included in the gradient coil unit 106.

For example, generally, the three spatial axes include a z-axis that extends laterally along the length of the subject 120 as positioned on the table 110 within the imaging space 120 (e.g., along the direction of from the subject's head to the subject's feet), an x-axis that extends in the direction planar with the surface of the table 110 (e.g., from the left side to the right side of the subject), and a y-axis that extends perpendicular from the surface of the table 110 (e.g., from the backside to the frontside of the patient 118). The respective magnetic field gradients $G_x$, $G_y$ and $G_z$ are used to spatially encode the RF signals relative to the three axes x, y and z of the MRI machine 100. This involves using one gradient to determine and localize the signals relative to the specific cross-sectional slice of the body being imaged with respect to one axis of the three axes. This gradient is referred to as the slice selection gradient and typically corresponds to the z-axis and thus $G_z$. A second gradient is used to frequency encode the signals along another axis or direction, referred to as the frequency encoding direction (e.g., typically either the x-axis or the y-axis), and the third gradient to phase encode the signals along the remaining axis or direction, referred to as the phase encoding direction (e.g., typically either the x-axis or the y-axis). To this end, the particular axis and thus gradients used as the slice selection axis, the frequency encoding axis and the phase encoding axis are defined prior to signal acquisition and can vary depending on the desired perspective of the anatomy being scanned and various additional factors.

To selectively excite a particular slice of the subject 118, the gradient coil unit 106 applies the slice selection gradient magnetic field via the corresponding gradient coil system onto the main magnetic field B0 along the direction of slice selection, typically the z-direction. The RF system also applies a slice selective RF pulse perpendicular to the direction of the slice selection gradient. The frequency of the RF pulse is tuned to match the resonance frequency of the protons in the desired slice. This RF pulse is typically applied for a specific duration and amplitude. The RF pulse causes the protons within the selected slice to absorb energy and transition from their low-energy state to a higher-energy state. This process is known as excitation. Protons outside the selected slice are not resonant with the RF pulse frequency and therefore do not absorb energy. After the application of the RF pulse, the slice selection gradient is reversed. This causes the precession frequencies of the protons within the selected slice to be reversed, effectively rephasing them. Once the protons within the selected slice are rephased, the gradient coil unit 106 applies the magnetic field gradients in the frequency encoding direction and the phase-encoding direction to spatially encode the signals relative to the additional axis (e.g., typically the x and y axis).

In this regard, in association with reconstructing a 2D image from the acquired signal data defined by a 2D array of pixels having dimensions x-y, the frequency encoding gradient is used to determine the signals corresponding to each position along one dimension (e.g., either the x or y dimension) of the image and the phase encoding gradient is used to determine the signals corresponding to each position along the other dimension (e.g., either x or y) of the image. Frequency encoding is achieved using a gradient magnetic field along one axis (usually the x-axis or readout direction). This gradient causes variations in the resonant frequency of the RF signals emitted by the hydrogen nuclei, allowing spatial information to be encoded along that axis. Phase encoding is achieved using a gradient magnetic field along another axis (usually the y-axis or phase encoding direction). This gradient causes variations in the phase of the RF signals emitted by the hydrogen nuclei, allowing additional spatial information to be encoded along that axis. During data acquisition, multiple phase encoding steps are performed to sample the signal along the phase encoding direction. Each phase encoding step corresponds to a different strength or duration of the phase encoding gradient, causing a different phase shift in the emitted RF signals. By acquiring data with different phase encoding steps, a series of lines or "k-space lines" are sampled along the phase-encoding direction. The number of phase encoding steps corresponds to the number of pixels to be included in the reconstructed image along one dimension of the image (e.g., either the x dimension or the y dimension). The number of phase encoding steps also controls the duration of time required to obtain signal data needed to create a 2D image of slice of the body imaged. Accordingly, the phase encoding direction can be selectively chosen to correspond to either the x-axis or the y-axis, depending on the particular region of the body being imaged, whichever requires the fewest number of phase encoding steps to cover the anatomy being imaged along the corresponding direction.

The RF system of MRI machine 101 includes an RF body coil unit 108 and/or one or more local RF coil arrays 112, 114 and 116. Based on control signals from the operating device 102, by the RF driver unit 128, the RF driver unit applies an RF pulse sequence for performing the 2D scan to the RF body coil unit 108 and/or the one or more local coil arrays 112, 114 and 116 to perform the prescribed RF pulse sequence. Responsive/emitted RF signals detected by the RF body coil unit 108 and/or the one or more local coil arrays 112, 114 and 116 are received by the data acquisition unit 126. The RF system includes at least one transmitting RF coil for producing a wide variety of RF pulses used in MRI pulse sequences and at least one receiving coil for receiving the responsive MR signals for relaying to the data acquisition unit 126 (e.g., via the RF port interface 122 and the T/R switch 124). The transmitting RF coil is responsive to the prescribed scan and direction indicated defined in by the prescribed RF waveform to produce one or more RF pulses of the desired frequency, phase and pulse amplitude waveform.

In accordance with MRI system 100, MRI machine 101 includes three local RF coil arrays 112, 114, and 116. The local RF coil arrays are disposed, for example, to enclose the region to be imaged of the subject 118. In the static magnetic field space or imaging space 120 where the main magnetic field $B_0$ is formed by the magnetostatic field magnet unit 104, the local RF coil arrays 112, 114 and 116 may transmit, based on a control signal from the operating device 102, an initial RF pulse that is an electromagnet wave to the subject 118 and thereby generates a high-frequency magnetic field $B_1$. This excites a spin of protons in the slice to be imaged of the subject 118. The local RF coil arrays 112, 114 and 116 may also transmit one or more additional refocusing RF pulses depending on the prescribed pulse sequence. The local RF coil arrays receive, as an RF signal, the electromagnetic wave generated when the proton spin returns into alignment with the initial magnetization vector following each refocusing pulse. In one embodiment, the local RF arrays coil may transmit and receive an RF pulse using the same local RF coil. In another embodiment, one or more of the local RF coil arrays may be used for only receiving the MR signals, but not transmitting the RF pulses. One or more of the RF coil arrays 112, 114 and/or 116 may be coupled to the table 110 and moved together with the table.

The RF body coil unit 108 is disposed, for example, to enclose the imaging space 120, and produces RF magnetic field pulses $B_1$ orthogonal to the main magnetic field $B_0$ produced by the magnetostatic field magnet unit 104 within the imaging space 120 to excite the nuclei. In contrast to the local RF coil arrays (such as local RF coil arrays 112, 114 and 116), which may be easily disconnected from the MRI machine 101 and replaced with another local RF coil, the RF body coil unit 108 is fixedly attached and connected to the MRI machine 101. Furthermore, whereas local coil arrays can transmit to or receive signals from only a localized region of the subject 118, the RF body coil unit 108 generally has a larger coverage area and can be used to transmit or receive signals to the whole body of the subject 118. Using receive-only RF coil arrays and transmit body coils provides a uniform RF excitation and good image uniformity at the expense of high RF power deposited in the subject. For a transmit-receive RF coil array, the coil array provides the RF excitation to the region of interest and receives the MR signal, thereby decreasing the RF power deposited in the subject. It should be appreciated that the particular use of the local RF coil arrays 112, 114 and 116 and/or the RF body coil unit 108 depends on the imaging application.

The T/R switch 124 can selectively electrically connect (e.g., via the RF port interface 122) the RF body coil unit 108 to the data acquisition unit 126 when operating in receive mode, and to the RF driver unit 128 when operating in transmit mode. Similarly, the T/R switch 124 can selectively electrically connect (e.g., via the RF port interface 122) one or more of the local RF coil arrays 112, 114 and/o 116 to the data acquisition unit 126 when the local RF coil arrays operate in receive mode, and to the RF driver unit 128 when operating in transmit mode. When the local RF coil arrays 112, 114 and/or 116 and the RF body coil unit 108 are both used in a single scan, for example if the local RF coil arrays are configured to receive MR signals and the RF body coil unit 108 is configured to transmit RF signals, then the T/R switch 124 may direct control signals from the RF driver unit 128 to the RF body coil unit 108 via the RF port interface 122 while directing received MR signals from the local RF coil arrays 112, 114 and/or 116 to the data acquisition unit 126. The RF body coil unit 108 may be configured to operate in a transmit-only mode, a receive-only mode, or a transmit-receive mode. The local RF coil arrays 112, 114 and/or 116 may be configured to operate in a transmit-receive mode or a receive-only mode.

The RF driver unit 128 can include a gate modulator, an RF power amplifier, and an RF oscillator (not shown) that are used to drive the RF coil arrays and form a high-frequency magnetic field in the imaging space 120. The RF driver unit 128 modulates, based on a control signal from the controller unit operating device 102 and using the gate modulator, the RF signal received from the RF oscillator into a signal of predetermined timing having a predetermined envelope. The RF signal modulated by the gate modulator may be amplified by the RF power amplifier and then output to the RF coil arrays.

The data acquisition unit 126 includes a preamplifier, a phase detector, and an analog/digital converter used to acquire the responsive RF signals received by the local RF coil arrays 112, 114, and 116 and/or the RF body coil unit 108. In the data acquisition unit 126, the phase detector phase detects, using the output from the RF oscillator of the RF driver unit 128 as a reference signal, the signals received from the RF coil arrays and/or the RF body coil unit 108 and amplified by the preamplifier, and outputs the phase-detected analog magnetic resonance signals to the analog/digital converter for conversion into digital signals. The digital signals thus obtained are output to the operating device 102 for image reconstruction processing thereof.

Figure 2:
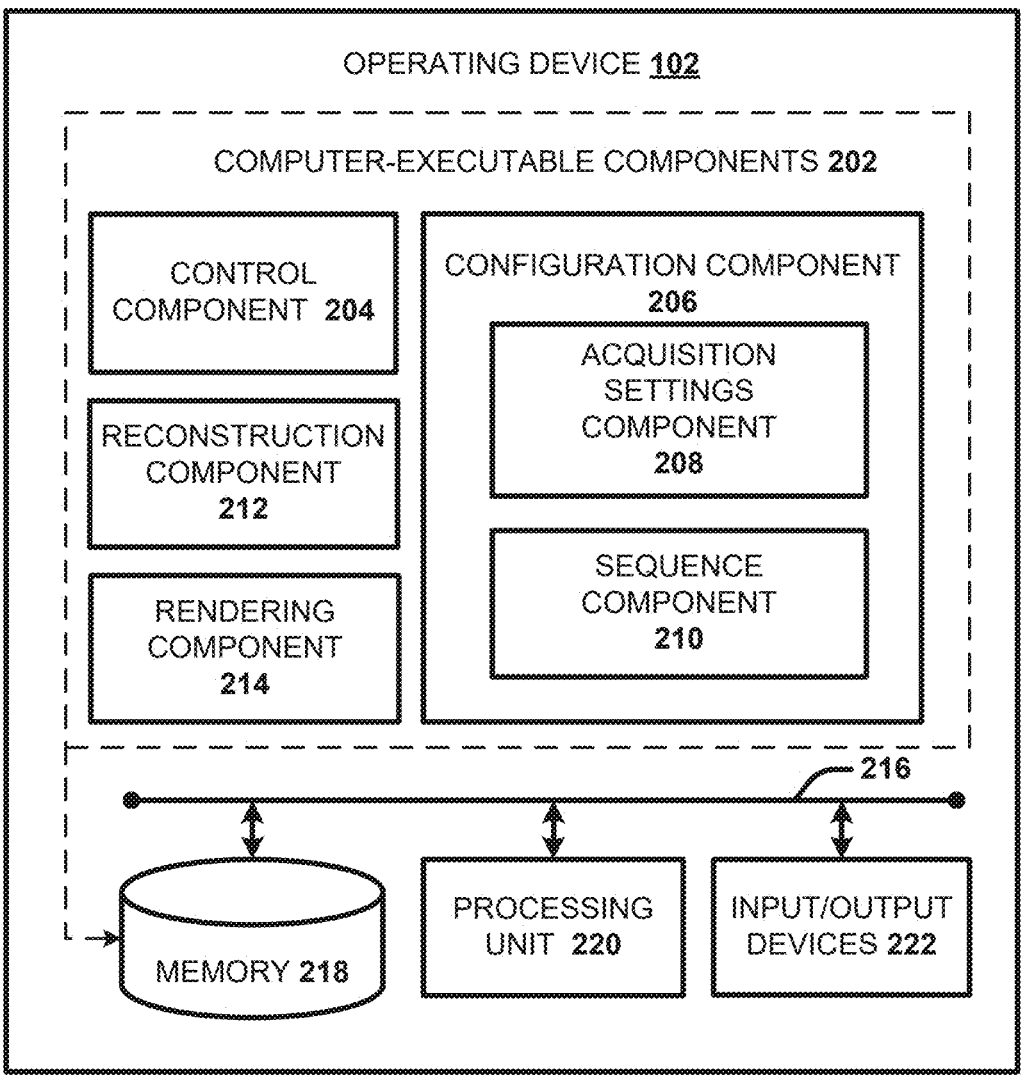
FIG. 2 presents a block diagram of an example operating device of an MRI system that facilitates integrating variable rate selective excitation (VERSE) and flow compensation along slice, in accordance with one or more embodiments of the disclosed subject matter.

FIG. 2 presents an example operating device 102 of MRI system 100 that facilitates controlling acquisition of 2D MRI images by the MRI machine 101 using a combination of a VERSE protocol and a flow compensation along slice protocol, in accordance with one or more embodiments of the disclosed subject matter. With reference to FIGS. 1 and 2, embodiments of systems (e.g., MRI system 100 and the like) described herein can include one or more machine-executable or computer-executable components embodied within one or more machines (e.g., embodied in one or more computer-readable storage media associated with one or more machines). Such components, when executed by the one or more machines (e.g., processors, computers, computing devices, virtual machines, etc.) can cause the one or more machines to perform the operations described.

For example, operating device 102 includes several machine/computer-executable components 202, including (but not limited to) control component 204, configuration component 206, reconstruction component 212 and rendering component 214. These computer/machine executable components 202 can be stored in (at least one) memory 218 of operating device 102 which can be coupled to (at least one) processing unit 220 (or processor) for execution thereof. Generally, the control component 204 can control acquisition of MR signal data associated with an anatomical region of the subject 118 via the MRI machine 101 in accordance with defined acquisition protocols and parameters provided by the configuration component 206. In accordance with the disclosed techniques, the configuration component 206 can configure (and/or facilitate configuring based in part on user input provided by the operating technician) the specific acquisition protocols and parameters that control the acquisition of the signal data in accordance with a 2D spin echo sequence incorporating a combination of a VERSE protocol and a flow compensation along slice protocol. The reconstruction component 212 can reconstruct an image of the anatomical region from the acquired signal data in accordance with the acquisition protocols and acquisition parameters employed, and the rendering component 214 can render the image via an electronic display coupled to the operating device 102.

Operating device 102 can also include one or more input/output devices 222 that facilitate receiving user input and/or rendering output data to users in association controlling operations of the MRI machine 101 and generating MR images. For example, the one or more input/output devices 222 can include an electronic display via which a control graphical user interface (GUI) can be presented (e.g., via rendering component 214) to an operating technician of the MRI machine 101 that controls performance of an MRI scan for the subject 118 to obtain one or more 2D images of an anatomical region of interest of the subject 118. Images reconstructed (e.g., via reconstruction component 212) based on signal data acquired from the scanned region of the subject 118 via the MRI machine 101 (e.g., via data acquisition unit 126) may also be rendered (e.g., via rendering component 218) via the control GUI. The input/output devices 222 can also include any suitable input device (e.g., a keyboard, a mouse, a touchscreen, etc.) that enables the operator to provide input via the control GUI that controls operations of the MRI machine 101, such as user input selecting/setting the particular slice and/or anatomical region to be scanned an imaged, user input selecting/setting one or more acquisition protocols and/or parameters to be applied for the scan, and so on.

Operating device 102 also includes a system bus 216 that communicatively and operatively couples the memory 218, the processing unit 220, and the input/output devices 222 to one another. Examples of said and memory 218, processing unit 220, input/output devices 222, and other suitable computer or computing-based elements, can be found with reference to FIG. 11 and can be used in connection with implementing system or components shown and described in connection with FIG. 2 and other figures disclosed herein.

In accordance with various embodiments, the control component 204 controls operations of the MRI machine 101 in accordance with instructions provided by the configuration component 206. To this end, the configuration component 206 can determine, define and/or configure (e.g., based in part on operator input received via the control GUI) the particular acquisition protocols and/or acquisition parameters to be applied by the MRI machine 101 for acquiring signal data associated with an anatomical region of the subject 118. In accordance with 2D MRI, the anatomical region can correspond to one or more cross-sectional regions of the subject. For example, as applied to multi-slice imaging, the anatomical region can correspond to a volume region of the subject 118 from which multiple, cross-sectional 2D image slices are to be acquired. With these embodiments, the configuration component 206 can define sperate, 2D spin echo sequences tailored to each slice. The control component 204 can in turn control acquisition of the signal data by the MRI machine 101 in accordance with the configured acquisition protocols and/or acquisition parameters defined for each slice. For example, the control component 204 can direct (e.g., via one or more control signals communicated by the control component 204 to the data acquisition unit 126, the RF driver unit 128 and the gradient driver unit) the MRI machine 101 to acquire MR signal data from each selected slice (or portion thereof) in accordance with the corresponding 2D MRI sequence defined for each slice.

In various embodiments, the particular acquisition protocols and/or acquisition parameters configured by the configuration component 206 and applied by the control component 204 can include a combination of a VERSE protocol and a flow compensation along slice protocol in conjunction with a standard, 2D MRI spin echo process. To facilitate this end, the configuration component 206 can include (but is not limited to), acquisition settings component 208 and sequence component 210.

In one or more embodiments, the acquisition settings component 208 can facilitate receiving user input in association with configuring the acquisition protocols and/or acquisition parameters to be applied for an MRI scan. In this regard, the acquisition settings component 208 can correspond to an interactive control application that enables the MRI operating technician to enter information in association with configuring the acquisition protocols and/or acquisition parameters to be applied for the MRI scan in accordance with the acquisition capabilities of the MRI system 100. For example, in association with setting up the MRI scan, the acquisition settings component 208 can enable the operating technician to select the appropriate MRI scan protocols and acquisition parameters based on the patient's clinical indication and the desired imaging parameters. This can include choosing the type of MRI sequence (e.g., TE, FSE, TSE, T1-weighted, T2-weighted, diffusion-weighted), the scan plane (e.g., axial, sagittal, coronal), setting the slice selection, frequency and phase encoding directions, and other acquisition parameters (e.g., field of view, slice thickness, matrix size).

For example, in some implementations, in association with setting up a multi-slice acquisition, the acquisition settings component 208 can enable the technician to prescribe the locations and orientations of the slices to be acquired. This can involve manually specifying the number of slices, their thickness, spacing, and orientation relative to the patient's anatomy. Additionally, or alternatively, the acquisition settings component 208 can automatically define these parameters based on a selected volume region of the patient to be scanned and the desired scan plane.

In association with setting up the MRI scan, the acquisition settings component 208 can also enable the operating technician to provide input selecting the appropriate scan protocols and sequence configuration parameters of the MRI scan sequence. For example, the acquisition settings component 208 can provide for selecting the type of MRI sequence to be applied. For multi-slice imaging, a 2D MRI sequence that allows for the acquisition of multiple slices in a single scan session, such as an FSE sequence or a TSE sequence is typically used. In another example, the acquisition settings component 208 can provide for receiving user input defining parameters that control the gradient and RF pulse sequence configuration. In accordance with some embodiments of the disclosed techniques, this can involve selecting whether to apply the disclosed combination of the VERSE protocol and the flow compensation along slice protocol. In some implementations, the acquisition settings component 208 can also provide for setting parameters such as the slice selection gradients, frequency and phase encoding gradients, RF pulse timing and shape, and other sequence-specific parameters.

Additionally, or alternatively, the sequence component 210 can automatically determine and/or define the parameters that control the gradient and RF pulse sequence configuration based on the selected MRI sequence type, the area of the anatomy being imaged, the prescribed locations and orientations of the slices, and the selected additional protocols to be applied. For example, in various embodiments, based on the prescribed slices and reception of user input via the acquisition settings component 208 selecting application of the disclosed combination of the VERSE and flow compensation along slice protocol along with a selected 2D spin echo sequence (e.g., an FSE sequence or another type of spin echo sequence), the sequence component 210 can automatically configure the gradient and RF pulse sequence configuration accordingly. Still in other embodiments, the acquisitions settings component 208 can automatically apply the combination of the VERSE protocol and the flow compensation along slice protocol based on the selected sequence type corresponding to a spin echo sequence, the particular area of the body being imaged (and/or other predefined criteria), and the sequence component 210 can configure the gradient and RF pulse sequence accordingly.

In this regard, in accordance with various embodiments, in association with usage of a 2D spin echo sequence for acquiring signal data in accordance with a 2D MRI scan, the sequence component 210 can determine, define, configure and/or control the MRI sequence parameters of the 2D spin echo sequence in accordance with a combination of flow compensation along slice protocol and a VERSE protocol. To this end, the VERSE protocol and the flow compensation along slice protocol involve tailoring the slice selection gradient waveform of in different ways to achieve different goals. For example, as described in the Background section, conventional flow compensation along slice involves tailoring the slice selection gradient waveform to account for motion in the slice direction. By carefully defining the parameters which control the shape and timing of gradient pulses in the slice selection direction, it is possible to null or minimize the effects of motion-induced phase shifts along the slice direction. The VERSE protocol employed involves reducing the amount of RF power associated with the signal acquisition, and thus the SAR associated with the signal acquisition, by reducing the peak amplitude of the RF pulses by a certain scaling factor and reshaping the corresponding slice selection gradient waveforms based on the scaling factor to excite the same slice. In accordance with the disclosed techniques the sequence component 210 optimizes the slice selection gradient waveform in a manner that accomplishes both goals.

Figures 3A, 3B:
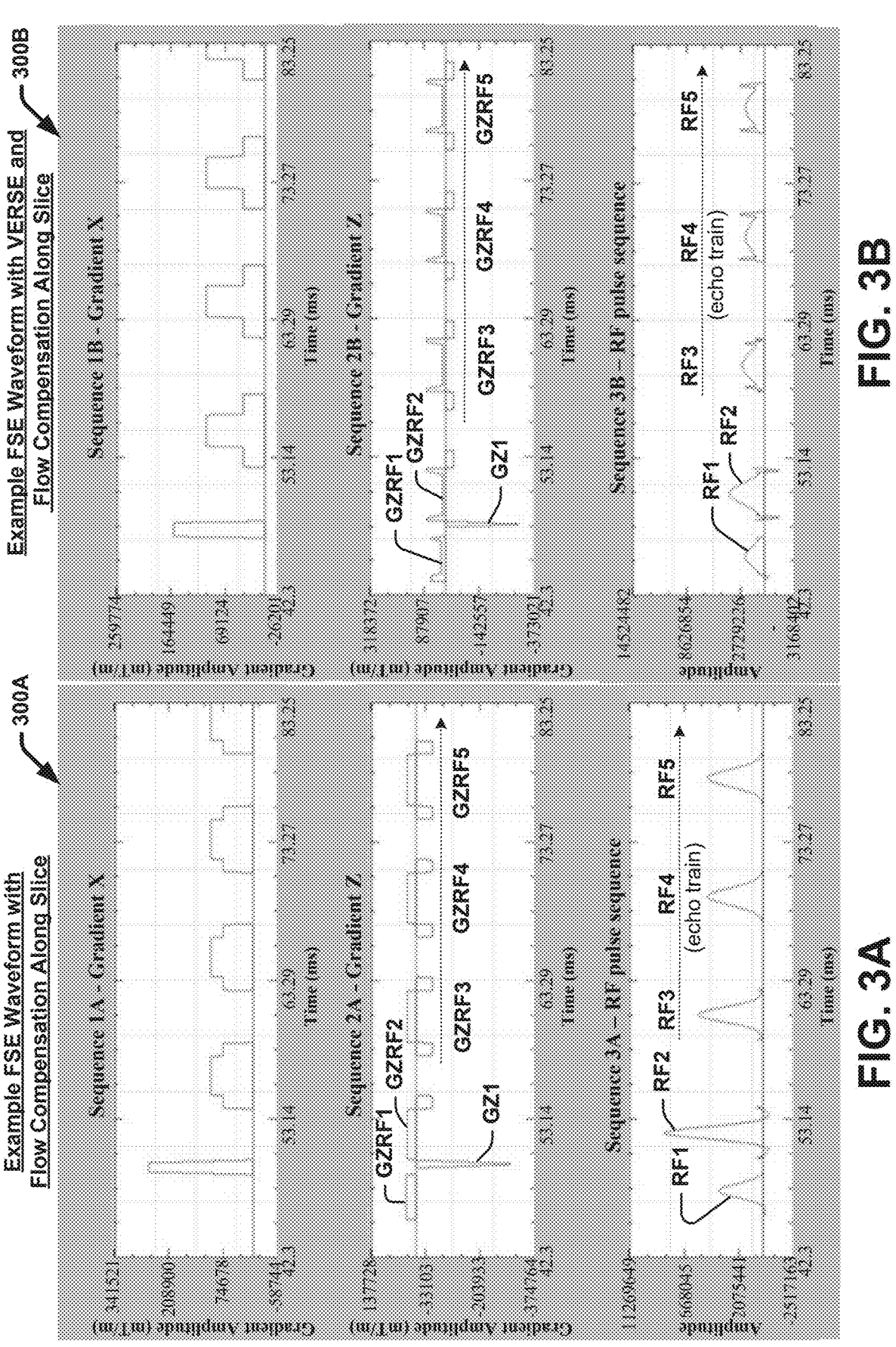
FIGS. 3A and 3B present example fast spin echo (FSE) sequence waveforms in accordance with flow compensation along slice with and without VERSE, in accordance with one or more embodiments of the disclosed subject matter.

In this regard, FIGS. 3A and 3B present example FSE sequence waveforms in accordance with flow compensation along slice with and without VERSE, in accordance with one or more embodiments of the disclosed subject matter. FIG. 3A presents an example FSE sequence waveform 300A defined in accordance with the flow compensation along slice protocol and without the VERSE protocol. FIG. 3B presents an example FSE sequence waveform 300B defined in accordance with the flow compensation along slice protocol and the VERSE protocol.

With reference to FIGS. 3A and 3B in view of FIGS. 1-2, the FSE sequence waveforms shown in FIGS. 3A and 3B respectively graphically represent the FSE sequence parameters defining the x and z gradient pulse sequences and the RF pulse sequences. The y gradient pulse sequence is omitted for sake of brevity. To this end, the RF pulse sequences (e.g., sequence 3A and sequence 3B) respectively define the sequence of RF pulses to be applied for signal acquisition associated with a selected slice of the subject 118 being imaged as a function of time (in milliseconds (ms)) and amplitude. In accordance with this example, RF1 corresponds to the initial excitation pulse of the FSE sequences and RF2 corresponds to the initial refocusing pulse. The additional RF pulses (e.g., RF3, RF4, RF5, etc.) correspond to the additional refocusing RF pulses of the echo train. It should be appreciated that only a portion of the echo train is illustrated for sake of brevity and that the echo train length can vary. The gradient pulse sequences define the timing of application of the respective x direction and z direction gradient pulses as a function of time and gradient amplitude.

In accordance with waveforms 300A and 300B, the z direction gradient waveforms, that is sequence 2A and sequence 2B, respectively correspond to the slice selection gradient waveform. To this end, in accordance with sequence 2A and 2B, each distinct linear segment extending above and below the baseline gradient amplitude value corresponds to a pulsed application of the Gz gradient magnetic field, that is the slice selection gradient. To this end, each distinct linear segment is defined by a distinct gradient waveform having a distinct shape, wherein the distinct shape corresponds to the manner in which the Gz magnetic field is applied with respect to adjusting and maintaining its applied strength/amplitude (e.g., measured in mT/m) over a short duration of time (e.g., typically less than a few milliseconds).

The slice selection gradient pulses are aligned in time with the RF pulses of the RF pulse sequence. For example, the distinct slice selection gradient pulses are referred to GZRF1, GZRF2, GZRF3, GZRF4, GZRF5 and so on, to indicate that the respective gradient pulses correspond to Gz gradient pulses applied in timed synchronization with RF1, RF2, RF3, RF4, RF5 and so on. To this end, GZRF1 corresponds to the excitation gradient as it is timed with application of the initial excitation pulse RF1, and GZRF2 corresponds to the initial refocusing gradient as it is timed with application of the initial refocusing pulse RF2. To this end, in accordance with the illustrated FSE sequence and others, the slice selection gradient waveform (e.g., sequence 2A and sequence 2B) can be referred to a comprising a plurality of distinct slice selection gradients (e.g., GZRF1, GZRF2, GZRF3, GZRF4, GZRF5 and so on).

In accordance with the disclosed flow compensation along slice protocol, the slice selection gradient waveform also includes a rephaser gradient (GZ1) that is applied between the excitation gradient (GZRF1) and the refocusing gradient (GZRF2). The rephaser gradient GZ1 (also referred to as the rewinder gradient or the crusher gradient), is used to compensate for the phase shifts induced by flowing substances, such as blood flow, during signal acquisition. The rephaser gradient GZ1 is used to rephase the magnetic moments of the protons within a slice and helps to reduce or eliminate unwanted phase shifts caused by flowing substances (as well as magnetic field inhomogeneities and motion), thereby minimizing flow artifacts in the image reconstructed using the acquired signal data. The rephaser gradient GZ1 has the opposite polarity and strength to the slice selection gradient GZRF1 and the refocusing gradient GZRF2. By applying an appropriate rephaser gradient tailored to the direction and velocity of flow, it is possible to minimize or eliminate flow-related artifacts in the resulting images, improving image quality and diagnostic accuracy.

In accordance with the subject VERSE protocol, the peak amplitudes of the RF pulses are reduced relative to the amplitudes of the peaks that would have been applied without the verses protocol. For example, as can be seen via comparison of sequence 3A relative to sequence 3B, the peaks of the RF pulses in sequence 3A (without VERSE applied) are substantially greater (and thus stronger in amplitude/power) relative to the peaks of the RF pulses in sequence 3B. To this end, in association with applying the VERSE protocol, the sequence component 210 scales down the peak amplitudes of the RF pulses by a certain scaling factor (e.g., as predefined and/or tailored based on operator input). The sequence component 210 also reshapes the corresponding slice selection gradient waveforms based on the scaling factor to excite the same slice. In association with reshaping the slice selection gradient waveforms, the VERSE protocol also controls the shapes of the slice selection gradient waveforms to be defined by an initial peak, followed by a steady hold at a lower amplitude, followed by another ending peak.

In this regard, FIGS. 4A and 4B present close-up views of the relevant slice selection gradients of sequence 3A and sequence 3B in accordance with one or more embodiments of the disclosed subject matter. To this end, the relevant slice selection gradients include the three initial slice selection gradients, which include the excitation gradient (GZRF1), the refocusing gradient (GZRF2), and the slice rephaser gradient (GZ1). FIG. 4A presents an enlarged view of the three gradients 400A as extracted from sequence 2A. FIG. 4B presents an enlarged view of the three gradients 400B as extracted from sequence 2B.

As can be seen via comparison of the waveform shape of the three gradients 400A relative to the waveform shape of the three gradients 400B, the shapes of the slice selection gradients GZRF1 and GZRF2 defined in accordance with flow compensation along slice only are different relative to the shapes of the slice selection gradients GZRF1 and GZRF2 defined in accordance with VERSE and flow compensation along slice. To this end, in accordance with flow compensation along slice without VERSE, the shapes of GZRF1 and GZRF2 are rectangular or substantially rectangular. However, in accordance with the VERSE protocol, the shapes GZRF1 and GZRF2 are non-rectangular or substantially irregular in comparison. In particular, as shown in the enlarged view of the three gradients 400B, in accordance with the VERSE protocol, the waveforms of both GZRF1 and GZRF2 are defined by two end peaks separated by a constant flat region. For example, with respect to GZRF1, the respective peaks are referred to as the left and right peaks of GZRF1, and labeled L1 and R1 respectively, and with respect to GZRF2, the respective peaks are referred to as the left and right peaks of GZRF2 and labeled L2 and R2 respectively. In one or more implementations, the respective left peaks are referred to as rephaser peaks and the right peaks are referred to as crusher peaks. In this regard, similar to the slice rephaser gradient GZ1, these peaks facilitate rephasing the magnetic moments of the protons within the slice in a manner that ensures accurate image formation and reduce artifacts. These peaks have opposite polarity and strength compared to middle portion of the respective gradients GZRF1 and GZRF2.

Figure 5:
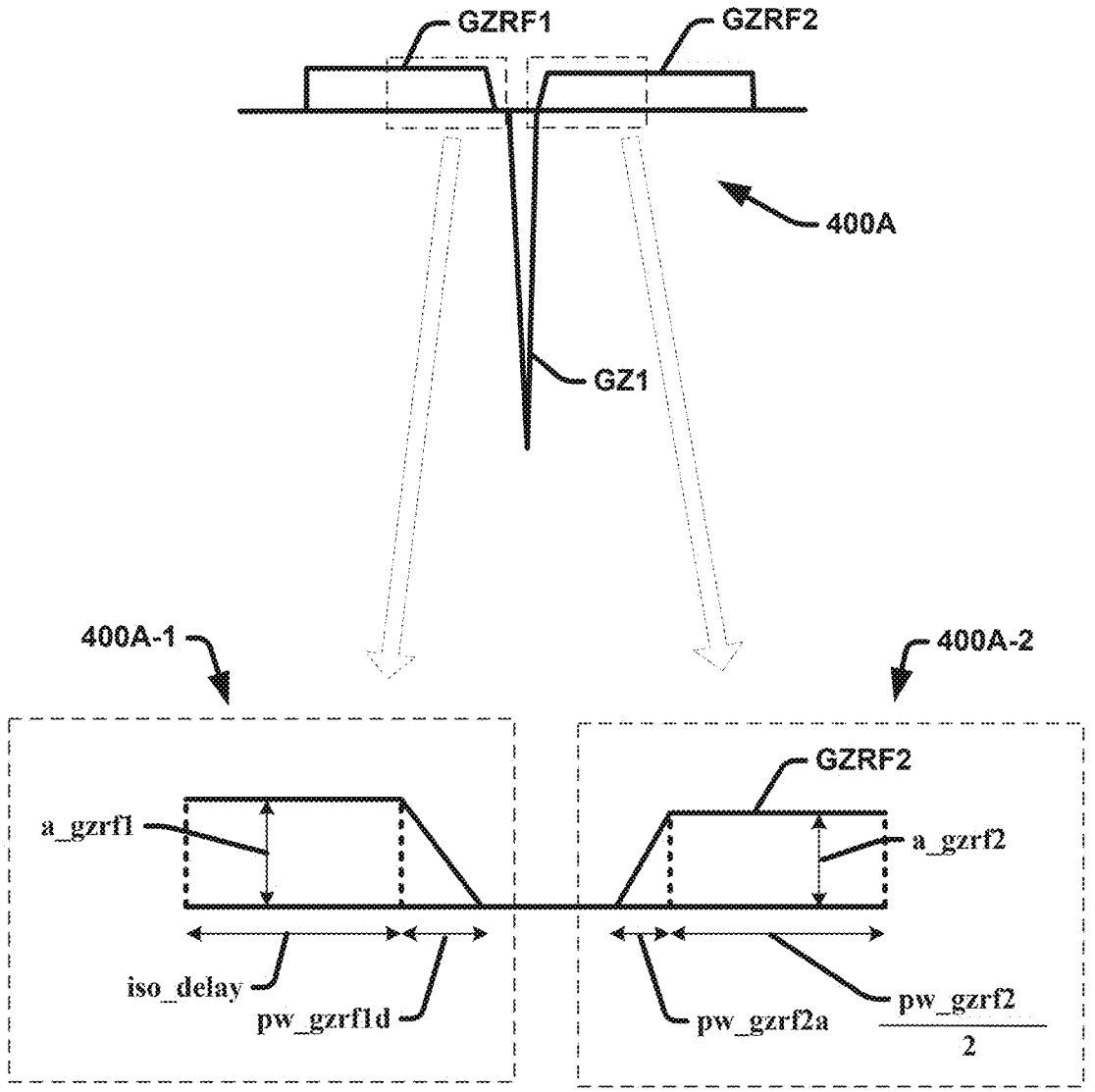
FIG. 5 presents an enlarged view of the shape of the slice selection gradients of an example FSE sequence waveform incorporating flow compensation along slice without VERSE, in accordance with one or more embodiments of the disclosed subject matter.
Figure 6:
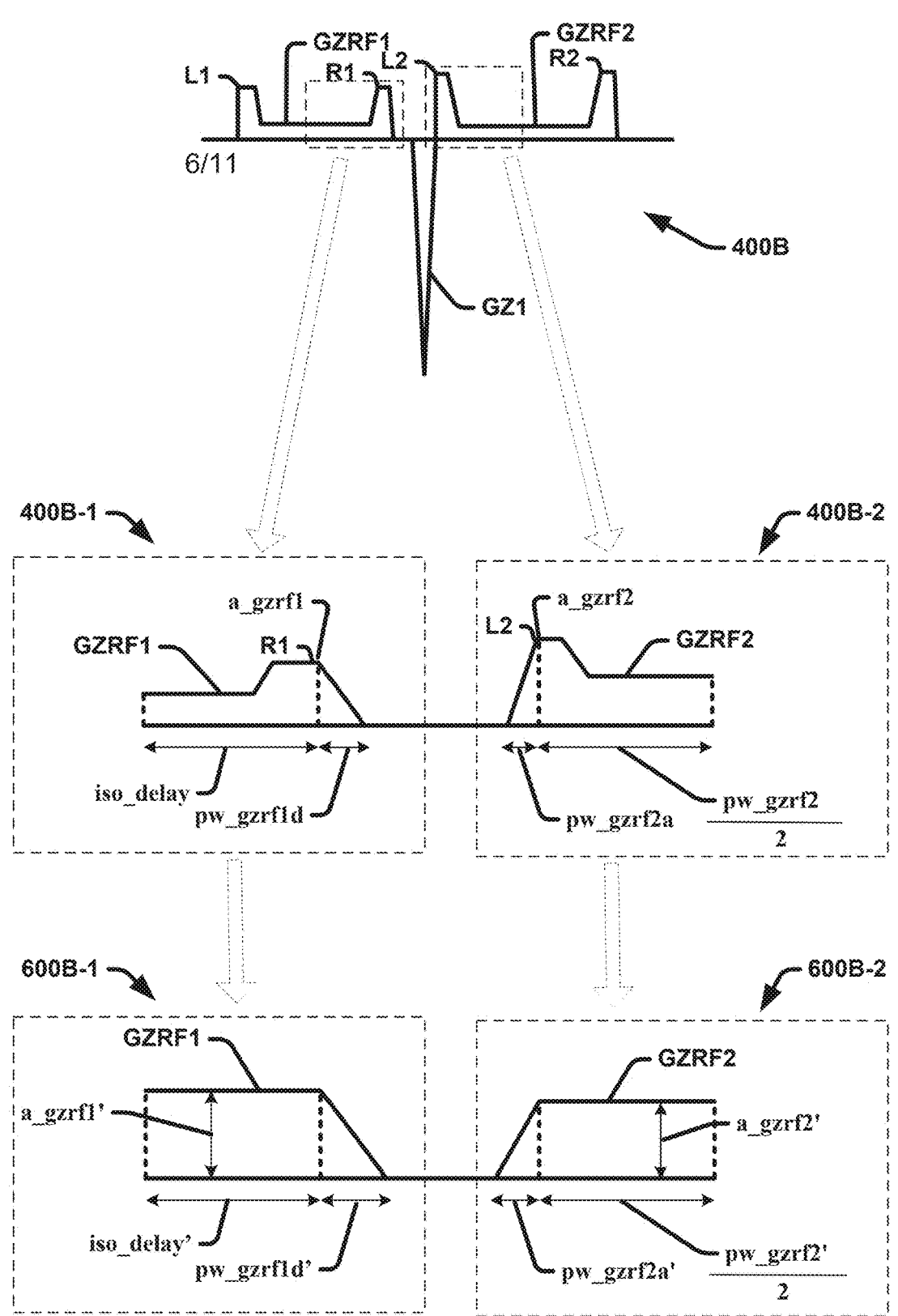
FIG. 6 presents an enlarged view of the shape of the slice selection gradients of an example FSE sequence waveform incorporating flow compensation along slice with VERSE, in accordance with one or more embodiments of the disclosed subject matter.

In accordance with the disclosed flow compensation along slice protocol, the sequence component 210 applies and defines the slice rephaser gradient (GZ1) waveform parameters based on the waveform parameters defining the excitation gradient (GZRF1) and the refocusing gradient (GZRF2). This involves determining the waveform parameters that define the respective waveforms of the excitation gradient (GZRF1) and the refocusing gradient (GZRF2) based on the geometrical shapes of the respective waveforms relative to the baseline and the respective areas defined by the geometrical shapes. Because the shapes of GZRF1 and GZRF2 without VERSE (e.g., as shown with respect to 400A) are substantially rectangular, the computation of these waveform parameters and the optimization of GZ1 based thereon is relatively straightforward, as shown in FIG. 5. However, in association with combining flow compensation along slice with the VERSE waveform, the sequence component 210 cannot directly accurately compute these parameters based on the irregular shapes of GZRF1 and GZR2 resulting from the VERSE protocol. To this end, in various embodiments, to enable flow compensation along slice with VERSE gradient waveforms, the sequence component 210 converts these gradients into equivalent rectangular shapes (of those corresponding to 400A), as shown in FIG. 6. Using the areas under these rectangular modeled VERSE gradients, the sequence component then computes reference gradient waveform parameters and uses these reference gradient parameters to determine and define the slice rephaser gradient GZ1.

For example, FIG. 5 illustrates relevant waveform parameters defining the excitation gradient (GZRF1) and the refocusing gradient (GZRF2) as extracted from the rectangular shaped versions of the corresponding gradient waveforms as included in sequence 2A. In particular, FIG. 5 presents an enlarged view of a portion 400A-1 of excitation gradient (GZRF1) shown in the corresponding dashed box of view 400A, and an enlarged view a portion 400A-2 of refocusing gradient (GZRF2) shown in the corresponding dashed box of view 400A. In accordance with the flow compensation along slice protocol in which VERSE is not applied portion 400A-1 of GZRF1 and portion 400A-2 of GZRF2 are rectangular or substantially rectangular. In this regard, the respective portions are defined by rectangular bodies with right triangles defined on the sides thereof. The waveform parameters defining GZRF1 that are used by the sequence component 210 to determine GZ1 include a_gzrf1 (corresponding to the height of the rectangular body of GZRF1), iso_delay (corresponding to the length of the rectangular body of GZRF1) and pw_gzrf1d (corresponding to the length of the right triangle portion of GZRF1). The sequence component 210 also computes the area defined by the shape of GZRF1 based on these parameters and also determines the rephaser gradient GZ1 based on the area of GZRF1. The waveform parameters defining GZRF2 that are used by the sequence component 210 to determine GZ1 include a_gzrf2 (corresponding to the height of the rectangular body of GZRF2), pw_gzrf2/2 (corresponding to the length of the rectangular body GZRF2) and pw_gzrf2a (corresponding to the length of the right triangle portion of GZRF2). The sequence component 210 also computes the area defined by the shape of GZRF2 based on these parameters and also determines the rephaser gradient GZ1 based on the area of GZRF2.

For example, FIG. 6 illustrates converting the irregular shaped VERSE gradients of sequence 2B into rectangular shapes corresponding to portion 400A-1 and portion 400A-2 in association with determining parameters of the VERSE gradients for defining the rephaser gradient GZ1 in accordance with the combined VERSE and flow compensation along slice protocol. To this end, 6 presents an enlarged view of a portion 400B-1 of excitation gradient (GZRF1) shown in the corresponding dashed box of view 400B, and an enlarged view a portion 400B-2 of refocusing gradient (GZRF2) shown in the corresponding dashed box of view 400B.

As shown with respect to portion 400B-1, the irregular shaped waveform of the VERSE defined gradient for GZRF1 can be defined by parameters a_gzfr1 (corresponding to the peak height of R1), iso_delay (corresponding to the length of the body of GZRF1) and pw_gzrf1d (corresponding to the length of the right triangle portion of GZRF1). As shown with respect to portion 400B-2, the irregular shaped waveform of the VERSE defined gradient for GZRF2 can be defined by parameters a_gzfr2 (corresponding to the peak height of L1), pw_gzrf2/2 (corresponding to the length of the body of GZRF2) and pw_gzrf2a (corresponding to the length of the right triangle portion of GZRF2).

In accordance with various embodiments, the sequence component 210 models the irregular shaped waveforms of GZRF1 and GZRF2 defined in accordance with the VERSE protocol into the corresponding rectangular versions shown in in FIG. 5 without the VERSE protocol. For example, as shown in FIG. 6, this can involve converting the shape of portion 400B-1 into the rectangular shape of portion 600B-1 and converting the shape of portion 400B-2 into the rectangular shape of portion 600B-2. The sequence component 210 further redefines the waveform parameters associated with GZRF1 and GZRF2 based on the modeled versions. In this regard, as shown in FIG. 6, using the modeled portions 600B-1 and 600B-2, the sequence component 210 determines reference parameters corresponding to estimated values of the parameters shown with respect to portion 400B-1 and 400B-2. For example, based on the modeled, rectangular shape of portion 600B-1, the sequence component 210 determines an updated waveform parameter for a_gzrf1, now referred to as a_gzrf1', an updated parameter for iso_delay, now iso_delay', and an updated parameter for pw_gzrf1d, now pw_gzrf1d'. The sequence component 210 also determines the geometrical area defined by the modeled version of GZRF1 based on the updated parameters. Likewise, based on the modeled, rectangular shape of portion 600B-2, the sequence component 210 determines an updated waveform parameter for a_gzrf2, now referred to as a_gzrf2', an updated parameter for pw_gzrf2a, now pq_gzrf2a', and an updated parameter for pw_gzrf2/2, now pw_gzrf2/2'. The sequence component 210 also determines the geometrical area defined by the modeled version of GZRF2 based on the updated parameters.

The sequence component 210 then defines waveform parameters of the rephaser gradient GZ1 using the computed areas and reference parameters determined based on the modeled versions of GZRF1 and GZRF2. However, in association with configuring the 2D FSE sequence to be applied for signal acquisition, the sequence component 210 does not use the modeled version of GZRF1 and GZRF2. In this regard, the sequence component 210 uses the original versions of GZRF1 and GZRF2 defined in accordance with the VERSE protocol having the waveform parameters shown with respect to portions 400B-1 and 400B-2 in accordance with their irregular shaped waveforms.

Figure 7:
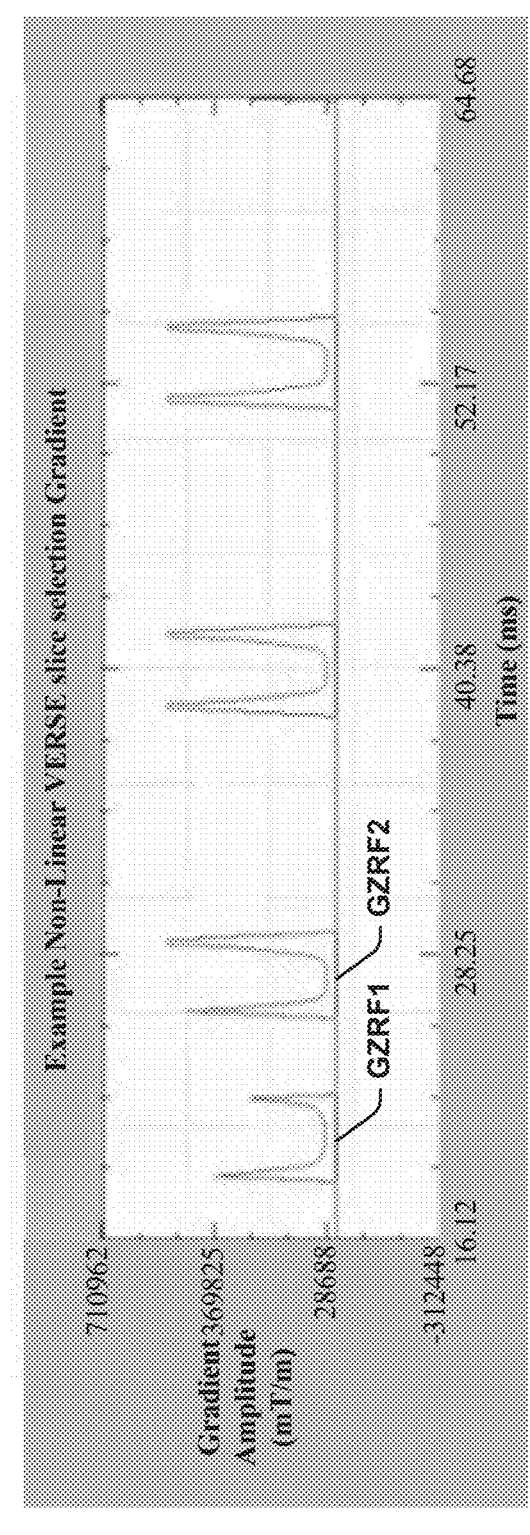
FIG. 7 presents an example non-linear VERSE slice selection gradient in accordance with one or more embodiments of the disclosed subject matter.

In accordance with the embodiments described above with reference to FIGS. 3A-5, the VERSE protocol applied by the sequence component 210 corresponds to a linear VERSE protocol. In this regard, in accordance with the linear VERSE protocol, although the shapes of the excitation gradient GZRF1 and the refocusing gradient GZRF2 are non-rectangular or irregular, the are defined by straight lines as opposed to curved lines. For example, FIG. 7 presents an example VERSE slice selection gradient 700 in accordance with a non-linear VERSE protocol. As shown in FIG. 7, in accordance with a non-linear VERSE protocol, the waveform shapes of the excitation gradient GZRF1 and the refocusing gradient GZRF2 are defined by irregular shapes including curved lines. In various embodiments, the usage of linear VERSE as opposed to non-linear VERSE enables efficient and accurate estimation of the waveform parameters and areas defined by the resulting gradients in accordance with the techniques described above with reference to FIG. 6. For example, although the ability to accurately and efficiently model the irregular shaped gradients defined in accordance with non-linear VERSE into equivalent rectangular versions (e.g., corresponding to portions 400A-1 and 400A-2) is sufficiently hindered by the curvature of their waveforms. Thus, the usage of linear VERSE as opposed to non-linear VERSE enables the sequence component 210 to efficiently and accurately define the rephaser gradient GZ1 in association with integrating the flow compensation along slice protocol with VERSE.

FIG. 8 presents example MRI images acquired with different acquisition protocols in accordance with one or more embodiments of the disclosed subject matter. In particular, FIG. 8 presents example MRI images of a cross-sectional view of a subject's spine sliced in accordance with the slice perspective shown in image 800 (wherein the slice perspective corresponds to the plane defined by the white line drawn relative to image 800). To this end, the images 801, 802 and 803 respectively correspond to axial c-spine images. Each of the MRI images were acquired via an MRI system corresponding to system 100 and using a 2D FSE sequence. Image 801 corresponds to an image acquired in accordance with the disclosed flow compensation along slice protocol. Image 802 corresponds to an image acquired in accordance with the disclosed combination of the VERSE and flow compensation along slice protocol, and image 803 corresponds to an image acquired with the 2D FSE sequence without flow compensation along slice and without VERSE.

As can be seen via comparison of image 803 and image 802, image 803 includes a flow artifact while image 803 excludes the flow artifact, thus demonstrating how the disclosed combined VERSE and flow compensation along slice protocol can be used to successfully minimize or eliminate flow artifacts. For example, the flow artifact included in image 803 corresponds to a flow void, which is entirely removed from image 802. In addition, although as demonstrated via image 801, that flow compensation along slice alone can result in minimizing the same flow artifact, without the VERSE protocol, the RF power utilized for the RF pulse sequence during signal acquisition is significantly higher. Thus, in comparison to the acquisition protocol and acquisition parameters used to acquire image 801, the combined VERSE and flow compensation along slice protocol used to acquire image 802 results in a reduced SAR.

FIG. 9 presents a high-level flow diagram of an example computer-implemented method 900 for performing an MRI scan using a combination of a VERSE protocol and a flow compensation along slice protocol, in accordance with one or more embodiments of the disclosed subject matter. Method 900 comprises at 902, determining, by a device comprising a processer (e.g., operating device 102), a 2D spin echo sequence applicable for acquiring, via a MRI system (e.g., MRI system 100), signal data associated with a slice of an anatomical region of a subject, wherein determining the 2D spin echo sequence comprises determining the 2D spin echo sequence in accordance with a combination of a (VERSE) protocol and a flow compensation along slice protocol (e.g., via sequence component 210). At 904, method 900 comprises controlling, by the device, acquisition of the signal data by the MRI system using the 2D spin echo sequence (e.g., via control component 204). At 906, method 900 comprises reconstructing, by the device, an image of the slice from the signal data (e.g., via reconstruction component 212).

To this end, in accordance method 900, based on employing the combination, the image comprises a defined image quality and a SAR of the acquisition is reduced relative to another SAR of a similar acquisition using a similar 2D spin echo sequence defined in accordance with the flow compensation along the slice protocol and without the VERSE protocol. In this regard, owing to the flow compensation along slice protocol, the defined image quality comprises absence of flow artifacts or an amount of the flow artifacts being less than a defined amount. For example, in various implementations, the spin echo sequence applied in accordance with method 900 corresponds to the sequence defined by waveform 300B. In comparison to the spin echo sequence defined by waveform 300B with flow compensation yet without VERSE, the RF pulses of the RF sequence are substantially reduced, thus decreasing the SAR associated with the acquisition. As applied in association with acquiring multiple-slices, the aggregate reduction in SAR for a multi-slice scan incorporating the combination of VERSE with flow compensation along slice can provide substantially clinical benefits while also optimizing image quality with respect to eliminating or reducing flow artifacts.

FIG. 10 presents a high-level flow diagram of an example computer-implemented method 1000 for performing an MRI scan using a combination of a VERSE protocol and a flow compensation along slice protocol, in accordance with one or more embodiments of the disclosed subject matter. Method 1000 comprises at 1002, defining (e.g., via sequence component 210), by a device comprising a processer (e.g., operating device 102), first slice selection gradient waveforms of a 2D spin echo sequence applicable for acquiring, via a MRI system (e.g., MRI system 100), signal data associated with a slice of an anatomical region of a subject, comprising determining the first slice selection gradient waveforms based on a scaling factor used to define peak amplitudes of radio frequency pulses of the 2D spin echo sequence in accordance with a VERSE) protocol, wherein the first slice selection gradient waveforms are defined by first shapes.

In this regard, with reference to FIGS. 1-10, the first slice selection gradients can correspond to the initial excitation gradient GZRF1 and the initial refocusing gradient GZRF2. As described with reference to FIGS. 3B, 4B and 6, in association with defining these slice selection gradients in accordance with the VERSE protocol, the shapes of the waveforms defining these gradients are non-rectangular and/or irregular in comparison with respect to the same gradients defined in accordance with flow compensation without VERSE. In this regard, the shapes of these first slice selection gradient waveforms correspond to those shown in FIG. 4B and view 400B.

Continuing with method 1000, at 1004, method 1000 comprises generating, by the device (e.g., via sequence component 210) modeled version of the first slice selection gradients waveforms having second shapes being more rectangular relative to the first shapes 1004, as described with reference to FIG. 6. At 1006, method 1000 comprises determining, by the device (e.g., via sequence component 210) parameters associated with the first slice selection gradient waveforms based on the modeled versions. For example, as described with reference to FIG. 6, this corresponds to determining the reference parameters, which corresponds to the updated parameters a_gzrf1', iso_delay', pw_gzrf1d', etc. the areas defined by the modeled versions of the gradient waveforms for GZRF1 and GZRF2.

At 1008, the 1000 comprises defining, by the device, a second slice selection gradient of the 2D spin echo sequence based on the parameters, the second slice selection gradient being configured to minimize motion induced phase shifts. For example, this corresponds to the sequence component 210 determining the waveform parameters of the rephaser gradient GZ1 based on the updated or reference parameters determined at 1006. In this regard, in various embodiments, in accordance with applying the disclosed combination of the VERSE protocol and the flow compensation along slice protocol, the sequence component 210 can be configured to first define the waveform parameters of the 2D spin echo sequence employed in accordance with the VERSE protocol. In other words, the sequence component 210 can first define the 2D spin echo sequence waveform in accordance with the VERSE protocol. This involves defining the RF pulse sequence waveform using RF pulses having reduced power profiles (e.g., reduced peak amplitudes) relative to the spin echo sequence without the VERSE protocol. This also involves defining the slice selection gradients (e.g., GZRF1, GZRF2, GZRF3, etc.) in accordance with the VERSE protocol as tailored to the reduced RF pulse amplitudes. The sequence component 210 can thereafter define the rephaser gradient in accordance with the flow compensation along slice protocol using the computed reference parameters for GZRF1 and GZRF2 determined in accordance with the techniques described with reference to FIG. 6.

At 1010, method 1000 comprise controlling, by the device (e.g., via control component 204), acquisition of the signal data via the MRI system in accordance with the 2D spin echo sequence (e.g., as configured by the sequence component 210). In this regard, the reconstruction component 212 can then reconstruct an image of the slice imaged using the acquired signal data.

One or more embodiments can be a system, a method, and/or a computer program product at any possible technical detail level of integration. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, procedural programming languages, such as the "C" programming language or similar programming languages, and machine-learning programming languages such as like CUDA, Python, Tensorflow, PyTorch, and the like. The computer readable program instructions can execute entirely on the user's computer, partly on the user's computer, as a stand-alone software package, partly on the user's computer and partly on a remote computer or entirely on the remote computer or server using suitable processing hardware. In the latter scenario, the remote computer can be connected to the user's computer through any type of network, including a local area network (LAN) or a wide area network (WAN), or the connection can be made to an external computer (for example, through the Internet using an Internet Service Provider). In various embodiments involving machine-learning programming instructions, the processing hardware can include one or more graphics processing units (GPUs), central processing units (CPUs), and the like. In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It can be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession may, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In connection with FIG. 9, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which can be explicitly illustrated herein.

Figure 11:
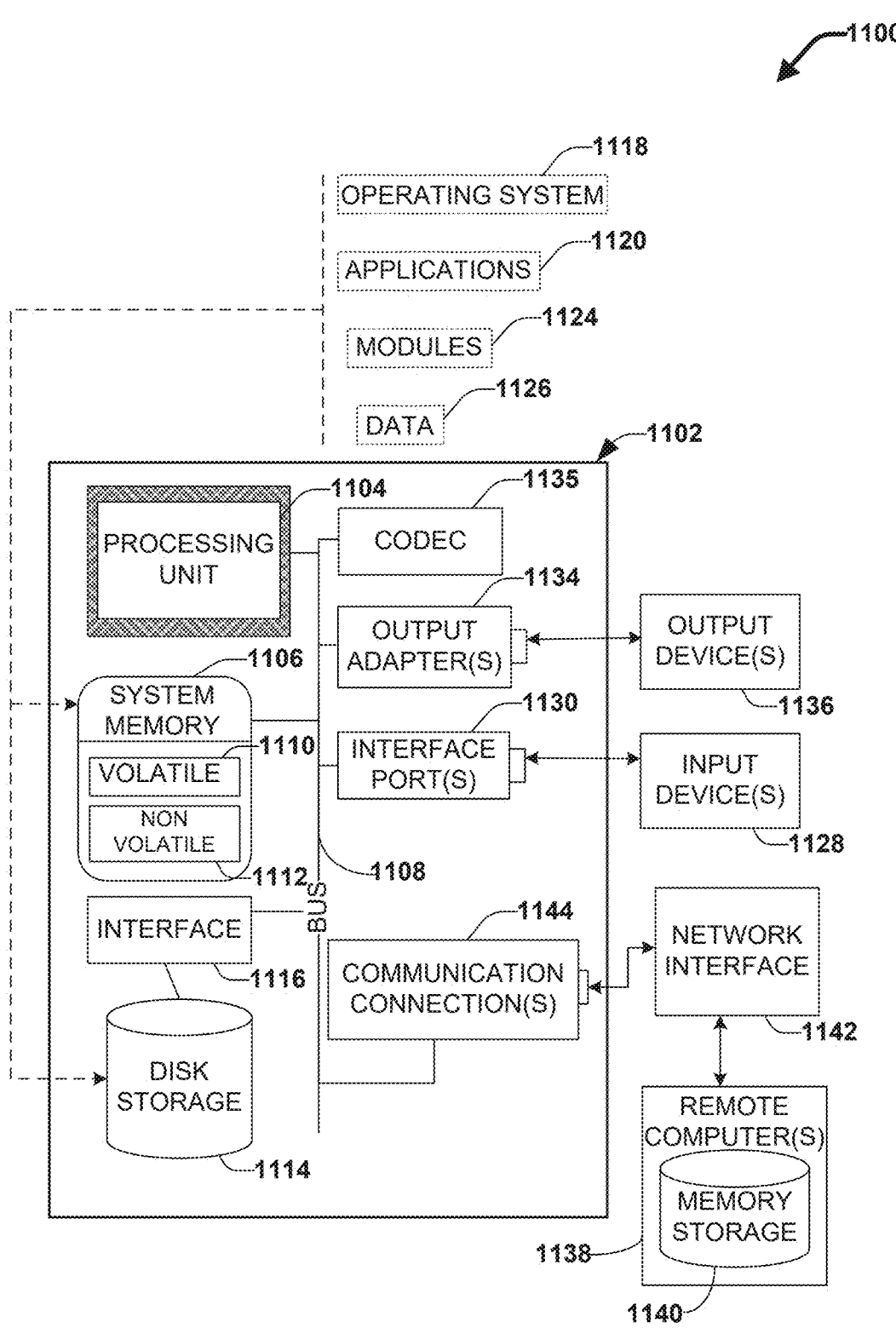
FIG. 11 illustrates a block diagram of an example, non-limiting operating environment in which one or more embodiments described herein can be facilitated.

With reference to FIG. 11, an example environment 1100 for implementing various aspects of the claimed subject matter includes a computer 1102. The computer 1102 includes a processing unit 1104, a system memory 1106, a codec 1135, and a system bus 1108. The system bus 1108 couples system components including, but not limited to, the system memory 1106 to the processing unit 1104. The processing unit 1104 can be any of various available processors. Dual microprocessors, one or more GPUs, CPUs, and other multiprocessor architectures also can be employed as the processing unit 1104.

The system bus 1108 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 11114), and Small Computer Systems Interface (SCSI).

The system memory 1106 includes volatile memory 1110 and non-volatile memory 1112, which can employ one or more of the disclosed memory architectures, in various embodiments. The basic input/output system (BIOS), containing the basic routines to transfer information between elements within the computer 1102, such as during start-up, is stored in non-volatile memory 1112. In addition, according to present innovations, codec 1135 can include at least one of an encoder or decoder, wherein the at least one of an encoder or decoder can consist of hardware, software, or a combination of hardware and software. Although, codec 1135 is depicted as a separate component, codec 1135 can be contained within non-volatile memory 1112. By way of illustration, and not limitation, non-volatile memory 1112 can include read only memory (ROM), programmable ROM (PROM), electrically programmable ROM (EPROM), electrically erasable programmable ROM (EEPROM), Flash memory, 3D Flash memory, or resistive memory such as resistive random access memory (RRAM). Non-volatile memory 1112 can employ one or more of the disclosed memory devices, in at least some embodiments. Moreover, non-volatile memory 1112 can be computer memory (e.g., physically integrated with computer 1102 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1110 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 1102 can also include removable/non-removable, volatile/non-volatile computer storage medium. FIG. 11 illustrates, for example, disk storage 1114. Disk storage 1114 includes, but is not limited to, devices like a magnetic disk drive, solid state disk (SSD), flash memory card, or memory stick. In addition, disk storage 1114 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1114 to the system bus 1108, a removable or non-removable interface is typically used, such as interface 1116. It is appreciated that disk storage 1114 can store information related to a user. Such information might be stored at or provided to a server or to an application running on a user device. In one embodiment, the user can be notified (e.g., by way of output device(s) 1136) of the types of information that are stored to disk storage 1114 or transmitted to the server or application. The user can be provided the opportunity to opt-in or opt-out of having such information collected or shared with the server or application (e.g., by way of input from input device(s) 1128).

It is to be appreciated that FIG. 11 describes software that acts as an intermediary between users and the basic computer resources described in the suitable operating environment 1100. Such software includes an operating system 1118. Operating system 1118, which can be stored on disk storage 1114, acts to control and allocate resources of the computer 1102. Applications 1120 take advantage of the management of resources by operating system 1118 through program modules 1124, and program data 1126, such as the boot/shutdown transaction table and the like, stored either in system memory 1106 or on disk storage 1114. It is to be appreciated that the claimed subject matter can be implemented with various operating systems or combinations of operating systems.

A user enters commands or information into the computer 1102 through input device(s) 1128. Input devices 1128 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1104 through the system bus 1108 via interface port(s) 1130. Interface port(s) 1130 include, for example, a serial port, a parallel port, a game port, and a universal serial bus (USB). Output device(s) 1136 use some of the same type of ports as input device(s) 1128. Thus, for example, a USB port can be used to provide input to computer 1102 and to output information from computer 1102 to an output device 1136. Output adapter 1134 is provided to illustrate that there are some output devices 1136 like monitors, speakers, and printers, among other output devices 1136, which require special adapters. The output adapters 1134 include, by way of illustration and not limitation, video and sound cards that provide a means of connection between the output device 1136 and the system bus 1108. It should be noted that other devices or systems of devices provide both input and output capabilities such as remote computer(s) 1138.

Computer 1102 can operate in a networked environment using logical connections to one or more remote computers, such as remote computer(s) 1138. The remote computer(s) 1138 can be a personal computer, a server, a router, a network PC, a workstation, a microprocessor based appliance, a peer device, a smart phone, a tablet, or other network node, and typically includes many of the elements described relative to computer 1102. For purposes of brevity, only a memory storage device 1140 is illustrated with remote computer(s) 1138. Remote computer(s) 1138 is logically connected to computer 1102 through a network interface 1142 and then connected via communication connection(s) 1144. Network interface 1142 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1144 refers to the hardware/software employed to connect the network interface 1142 to the bus 1108. While communication connection 1144 is shown for illustrative clarity inside computer 1102, it can also be external to computer 1102. The hardware/software necessary for connection to the network interface 1142 includes, for exemplary purposes only, internal and external technologies such as, modems including regular telephone grade modems, cable modems and DSL modems, ISDN adapters, and wired and wireless Ethernet cards, hubs, and routers.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration and are intended to be non-limiting. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations can be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
determining, by a device comprising a processer and based on a combination of a variable rate selective excitation (VERSE) protocol and a flow compensation along slice protocol, a two-dimensional (2D) spin echo sequence applicable for acquiring, via a magnetic resonance imaging (MRI) system, signal data associated with a slice of an anatomical region of a subject, wherein the determining comprises:
    defining, by the device, first slice selection gradient waveforms of the 2D spin echo sequence in accordance with the VERSE protocol; and
    defining, by the device, a second slice selection gradient waveform of the 2D spin echo sequence in accordance with the flow compensation along slice protocol and based on the first slice selection gradient waveforms;
controlling, by the device, acquisition of the signal data by the MRI system using the 2D spin echo sequence; and
reconstructing, by the device, an image of the slice from the signal data.

2. The method of claim 1, wherein based on determining the 2D spin echo sequence in accordance with the combination, the image comprises a defined image quality and a specific absorption rate (SAR) of the acquisition is reduced relative to another SAR of a similar acquisition using a similar 2D spin echo sequence defined in accordance with the flow compensation along slice protocol and without the VERSE protocol.

3. The method of claim 2, wherein the defined image quality comprises absence of flow artifacts or an amount of the flow artifacts being less than a defined amount.

4. The method of claim 1, wherein the defining the first slice selection gradient waveforms is further based on a scaling factor used to define peak amplitudes of radio frequency pulses of a radio frequency pulse sequence of the 2D spin echo sequence.

5. The method of claim 4, wherein the first slice selection gradient waveforms respectively comprise non-rectangular geometries, and wherein defining the second slice selection gradient waveform comprises:
    generating, by the device, modeled versions of the first slice selection gradient waveforms having rectangular geometries;
    determining, by the device, parameters associated with the first slice selection gradient waveforms based on the modeled versions; and
    determining, by the device, the second slice selection gradient waveform based on the parameters.

6. The method of claim 5, wherein determining the parameters comprises determining geometrical areas defined by rectangular geometries of the modeled versions and determining the parameters based on the geometrical areas.

7. The method of claim 5, wherein the second slice selection gradient waveform comprises a slice rephaser gradient waveform.

8. The method of claim 5, wherein the first slice selection gradient waveforms comprise a gradient waveform aligned in time with an initial excitation pulse of the radio frequency pulses and another gradient waveform aligned in time with an initial refocusing pulse of the radio frequency pulses, and wherein the second slice selection gradient waveform is positioned between the first slice selection gradient waveforms.

9. The method of claim 1, wherein the 2D spin echo sequence comprises a fast spin echo sequence.

10. A magnetic resonance imaging (MRI) system, comprising:
at least one memory that stores computer-executable components; and
at least one processor that executes the computer-executable components stored in the at least one memory, wherein the computer-executable components comprise:
    a configuration component that determines a two-dimensional (2D) spin echo sequence applicable for acquiring, via the MRI system, signal data associated with a slice of an anatomical region of a subject, wherein the configuration component determines the 2D spin echo sequence in accordance with a combination of a variable rate selective excitation (VERSE) protocol and a flow compensation along slice protocol, and wherein the configuration component defines first slice selection gradient waveforms of the 2D spin echo sequence in accordance with the VERSE protocol, and further defines a second slice selection gradient waveform of the 2D spin echo sequence in accordance with the flow compensation along slice protocol and based on the first slice selection gradient waveforms;
    a control component that controls acquisition of the signal data by the MRI system using the 2D spin echo sequence; and
    a reconstruction component that generates an image of the slice from the signal data.

11. The MRI system of claim 10, wherein based on the configuration component determining the 2D spin echo sequence in accordance with the combination, the image comprises a defined image quality and a specific absorption rate (SAR) of the acquisition is reduced relative to another SAR of a similar acquisition using a similar 2D spin echo sequence defined in accordance with the flow compensation along slice protocol and without the VERSE protocol.

12. The MRI system of claim 11, wherein the defined image quality comprises absence of flow artifacts or an amount of the flow artifacts being less than a defined amount.

13. The MRI system of claim 11, wherein the configuration component defines the first slice selection gradient waveforms based on a scaling factor used to define peak amplitudes of radio frequency pulses of a radio frequency pulse sequence of the 2D spin echo sequence.

14. The MRI system of claim 13, wherein the first slice selection gradient waveforms respectively comprise non-rectangular geometries, and wherein the configuration component:
    generates modeled versions of the first slice selection gradient waveforms having rectangular geometries;

determines parameters associated with the first slice selection gradient waveforms based on the modeled versions; and determines the second slice selection gradient waveform based on the parameters.

15. The MRI system of claim 14, wherein the configuration component determines geometrical areas defined by rectangular geometries of the modeled versions and determines the parameters based on the geometrical areas.

16. The MRI system of claim 14, wherein the second slice selection gradient waveform comprises a slice rephaser gradient waveform.

17. The MRI system of claim 14, wherein the first slice selection gradient waveforms comprise a gradient waveform aligned in time with an initial excitation pulse of the radio frequency pulses and another gradient waveform aligned in time with an initial refocusing pulse of the radio frequency pulses, and wherein the second slice selection gradient waveform is positioned between the first slice selection gradient waveforms.

18. A non-transitory machine-readable storage medium, comprising executable instructions that, when executed by a processor, facilitate performance of operations, comprising:

determining a two-dimensional (2D) spin echo sequence applicable for acquiring, via a magnetic resonance imaging (MRI) system, signal data associated with a slice of an anatomical region of a subject, wherein determining the 2D spin echo sequence comprises:

defining first slice selection gradient waveforms of the 2D spin echo sequence in accordance with a variable rate selective excitation (VERSE) protocol, and defining a second slice selection gradient waveform of the 2D spin echo sequence in accordance with a flow compensation along slice protocol and based on the first slice selection gradient waveforms;

controlling acquisition of the signal data by the MRI system using the 2D spin echo sequence; and generating an image of the slice from the signal data.

19. The non-transitory machine-readable storage medium of claim 18, wherein the defining the first slice selection gradient waveforms is further based on a scaling factor used to define peak amplitudes of radio frequency pulses of a radio frequency pulse sequence of the 2D spin echo sequence.

20. The non-transitory machine-readable storage medium of claim 19, wherein the first slice selection gradient waveforms respectively comprise non-rectangular geometries, and wherein defining the second slice selection gradient waveform comprises:

generating modeled versions of the first slice selection gradient waveforms having rectangular geometries;

determining parameters associated with the first slice selection gradient waveforms based on the modeled versions; and determining the second slice selection gradient waveform based on the parameters.

\*  \*  \*  \*  \*